United States Patent [19]
Jie et al.

[11] Patent Number: 6,133,954
[45] Date of Patent: *Oct. 17, 2000

[54] INTEGRATED CIRCUIT COLOR CHIP WITH CELLS WITH INTEGRAL COLOR FILTERS INCLUDING TRIPLETS OF PHOTODIODES WITH EACH HAVING INTEGRATED THEREWITH TRANSISTORS FOR READING FROM AND WRITING TO THE PHOTODIODE AND METHODS OF MANUFACTURE AND OPERATION THEREOF

[75] Inventors: Liang Jie; Siang-Tze Wee, both of Singapore, Singapore

[73] Assignee: Tritech Microelectronics, Ltd., Singapore

[*] Notice: This patent issued on a continued prosecution application filed under 37 CFR 1.53(d), and is subject to the twenty year patent term provisions of 35 U.S.C. 154(a)(2).

[21] Appl. No.: 08/616,139

[22] Filed: Mar. 14, 1996

[51] Int. Cl.[7] .............................. H04N 3/14; H01L 31/06
[52] U.S. Cl. ........................... 348/308; 348/281; 257/462
[58] Field of Search .................................. 348/275, 281, 348/272, 273, 302, 308, 47, 241; 257/440, 239, 461, 462

[56] References Cited

U.S. PATENT DOCUMENTS

| | | | |
|---|---|---|---|
| 3,946,151 | 3/1976 | Kamiyana | 348/241 |
| 4,318,123 | 3/1982 | Knop | 348/275 |
| 4,441,123 | 4/1984 | Ochi | 348/275 |
| 4,580,160 | 4/1986 | Ochi et al. | 348/276 |
| 4,668,971 | 5/1987 | Hynecek | 257/239 |
| 4,875,091 | 10/1989 | Yamada et al. | 358/42 |
| 4,954,895 | 9/1990 | Akimoto | 348/273 |
| 5,122,881 | 6/1992 | Nishizawa et al. | 348/308 |
| 5,132,251 | 7/1992 | Kim et al. | 257/440 |
| 5,274,250 | 12/1993 | Miyake et al. | 257/239 |
| 5,350,490 | 9/1994 | Lee | 156/65 |
| 5,471,515 | 11/1995 | Fossum et al. | 257/239 |
| 5,504,524 | 4/1996 | Lu et al. | 348/223 |
| 5,528,295 | 6/1996 | Wagner | 348/281 |
| 5,608,243 | 3/1997 | Chi et al. | 257/462 |
| 5,619,262 | 4/1997 | Uno | 348/308 |
| 5,682,198 | 10/1997 | Katayama et al. | 348/47 |
| 5,712,497 | 1/1998 | Watanabe et al. | 257/462 |
| 5,841,126 | 11/1998 | Fossum et al. | 348/308 |

*Primary Examiner*—Wendy Garber
*Assistant Examiner*—Alicia M. Harrington
*Attorney, Agent, or Firm*—George O. Saile; Stephen B. Ackerman; Graham S. Jones, II

[57] ABSTRACT

A single integrated-circuit color camera chip is color sensitive by grouping closely-adjoining light-detecting cells in a photodiode array into triplets. Each pixel of the sensor includes both a read transistor and a write transistor. Each cells in the triplet is similar, but each cell is associated with a color filter of a different color, with red, green or blue cells in an R-G-B system. The proximity and small size of the cells in a triplet allows accurate color differentiation each pixel. Color information is adjusted on-chip for color, brightness and contrast before being sent to an external read device or display device. The color filter is a series of passive layers formed on the integrated circuit surface permitting the selective transmission of light or electromagnetic radiation of certain frequency ranges. The filter may be coated onto a semiconductor wafer after the latter has undergone conventional MOS process steps.

36 Claims, 9 Drawing Sheets

INTEGRATED CIRCUIT COLOR CHIP WITH CELLS WITH INTEGRAL COLOR FILTERS INCLUDING TRIPLETS OF PHOTODIODES WITH EACH HAVING INTEGRATED THEREWITH TRANSISTORS FOR READING FROM AND WRITING TO THE PHOTODIODE AND METHODS OF MANUFACTURE AND OPERATION THEREOF

BACKGROUND OF THE INVENTION

1. Field of the Invention

This invention relates to the design and methods of manufacture of semiconductor integrated circuits for color camera chips as well as black-and-white camera chips in standard integrated circuit technology, and more particularly to MOSFET camera chips.

2. Description of Related Art

U.S. Pat. No. 5,350,490 of Lee for "Forming a Color Filter On A Semiconductor Substrate" describes a method of forming a color filter on an integrated circuit device for a Charge Coupled Device (CCD) or a Bucket Brigade Device (BBD) type of system.

U.S. Pat. No. 4,875,091 of Yamada et al for "Field-Sequential Color Imaging Apparatus" shows a rotary color filter for an imaging apparatus; and an electrical system for color imaging.

In contemporary designs, the photodiode in each detector cell is associated with a single transistor. Hence, both read signals and write signals to the photodiode share a single path. This causes excessive parasitic signals in the shared datapath which degrade performance.

There are problems with a system-level approach of achieving color sensitivity in photodiode arrays.

There are system-level designs which use several sets of photodiode-arrays with one for each color and discrete color filters and external gain-circuits, which is expensive. A performance problem with a system level circuit is that an error-correction function is required to account for the fact that the use of multiple discrete photodiode-arrays means that slightly different images fall on each array.

SUMMARY OF THE INVENTION

An object of this invention is to allow a MOS photodiode array device to detect color images and provide accurate output signals to a display device, or other read devices. This can be achieved by having additional steps to the MOS process to selectively coat an electrically passive color filter onto the MOS wafer, to provide color sensitivity to the photodiode cells.

An object of this invention is to provide an integrated circuit which functions as an image detector which employs two transistors in a photosensor pixel array with reduced parasitics.

In addition, there is a need for a single chip image detector with an on-chip color filter.

Moreover there is a need for on chip color balancing.

Another object of this invention is to provide an image detector with a compact lens arrangement to focus light and reduce the size of each individual light sensitive region in the device.

An object of this invention is to provide an integrated circuit which functions as an image detector which provides an output signal representing the detected image with a two-dimensional array of groups of sensor cells, wherein each of said sensor cells has a photodiode and a pair of transistors for writing to and reading from said photodiode. The cell sensing incident electromagnetic radiation, and sense-amplifiers are associated with said cells.

The invention provides an MOS, multi-color sensitive photodiode-array which possesses on-chip image-detection, color differentiation and color-balancing schemes.

Another aspect of the invention is the use of a multi-port photodiode. There are completely separate datapaths for read signals ("reads") and write signals ("writes") to the photodiode.

In accordance with this invention an integrated circuit color image-detection system provides on-chip color differentiation. For example, a plurality of color filters, which are associated with the photodiodes provide color sensitivity. There are separate signal paths for the each color information signal, so that color differentiation can be carried to the read device. There are charge-amplifiers closely-associated with each color-detector cell or with each column of detector cells which detect a given color, which is necessary because of the weak strength of the residual charge from the exposed photodiodes in the sense-array (which is in the order or tens of femtocoulombs). Optional use is made of separate (or multiple) read and write paths to the photodiode in each detector cell to reduce parasitics in each path. This is important in view of the weak strength of the photodiode signals. There is an on-chip color balancing scheme, in which the strength of each color signal is adjusted using coefficients which could be hardwired. Alternatively, the color signal adjustment coefficients are temporarily loaded onto chip memory.

It is preferred that there is a staggered layout arrangement of the detector cells within the photodiode-array arranges the light-insensitive areas between detector cells are irregularly. This irregular arrangement of cells prevents noticeable loss or resolution due to the dead spaces formed between regular rows or columns of light-insensitive areas.

Preferably there are irregular arrangements or R-G-B detector cells within each group or detector cells are provided. For example, one group of detector cells may be arranged as R-G-B, while another is arranged as G-R-B and a third is arranged as B-G-R. This arrangement further reduces parallel errors between each color component of an image signal.

In accordance with this invention an integrated circuit which functions as an image detector. The integrated circuit comprises a two-dimensional array of rows and columns of color detector cells with the detector cells are associated with passband filter means for selectively detecting electromagnetic radiation within a plurality of bands of electromagnetic information. Each of the detector cells has a photodiode and transistors for writing signals to and reading signals from the photodiode. Each of the cells includes means for sensing incident electromagnetic radiation of a plurality of predetermined ranges of electromagnetic wavelengths by virtue of associated passband filter means for the wavelength formed over the photodiodes on the integrated circuit. The filter means has a diversity of passbands associated with different cells in a the group, wherein the circuit is implemented in a technology selected from the group consisting of CMOS, PMOS, NMOS, BiCMOS and BiMOS technologies.

Preferably the integrated circuit includes an array of charge sense-amplifiers closely associated with the detector cells; with separate signal paths for the plurality of detector cells, whereby individual radiation information is not lost; the integrated circuit includes on-chip means for radiation band-differentiation provided by means for providing filtration of radiation band filters on the integrated circuit chip, whereby a single matrix detector array provides accurate radiation band image reproduction in a radiation band image sensing system. It is preferred that the radiation bands are bands of color passed through a color filter and the system provides color signals from the cells, wherein an on-chip color band-balancing system is provided for scaling a color signal anywhere in its on-chip signal path, whereby the magnitude of the scaling transformation is adapted to be adjusted externally to provide hue control and enhanced color reproduction. It is further preferred that each color sensing cell has its own charge sense-amplifier; that the color sensing cells share charge sense-amplifiers between a plurality of detector cells of a particular color in a column; and/or that the integrated circuit includes color sensing cells sharing of charge sense-amplifiers between several detector cells of a predetermined color passband in a column of cells.

Preferably the detector cells are arranged in groups of a plurality of cells having different passbands of sensitivity to staggered arrangement of color detector cells within each group of detector cells which detect a single picture element, the staggered arrangement allowing the circuit to detect changes in luminance at boundaries between groups of detector cells.

Preferably, the integrated circuit uses an irregular layout arrangement of detector cells in each pixel group of the photodiode array.

Preferably, the integrated circuit includes embedded color-encoding circuitry and power-amplification circuitry for driving a device selected from the group consisting of a read device and a television receiver.

Preferably the integrated circuit device is able to output a video signal; wherein a composite video signal encompassing all the color image information, or to output several individual color or luminance signals to a read or display device.

Preferably, the integrated circuit detects both still image and moving image signals.

Preferably, the integrated circuit is incorporated in a lightweight, portable, miniature camera system.

Preferably, the integrated circuit is incorporated in a low power camera for use in portable applications.

In accordance with this invention, an integrated circuit functions as an image detector. The integrated circuit comprises a two-dimensional array of rows and columns of color detector cells with the detector cells are associated with passband filter means for selectively detecting electromagnetic radiation within a plurality of bands of electromagnetic information. Each of the detector cells has a photodiode and transistors for writing signals to and reading signals from the photodiode.

Each of the cells includes means for sensing incident electromagnetic radiation of a plurality of predetermined ranges of electromagnetic wavelengths by virtue of associated passband filter means for the wavelength formed over the photodiodes on the integrated circuit, with the filter means has a diversity of passbands associated with different cells in a the group, wherein the circuit is implemented in a technology selected from the group consisting of CMOS, PMOS, NMOS, BiCMOS and BiMOS technologies.

In accordance with this invention an integrated circuit functions as a color image detector comprising a two-dimensional array of groups of detector cells, each group comprising several detector cells adapted for sensing a different complementary color passband color. Each of the detector cells has a photodiode and at least two transistors for writing to and reading from the photodiode. Each of the groups of cells includes means for sensing incident color in the light radiation range of wavelengths of a plurality of predetermined ranges of color wavelengths by virtue of associated passband filter means for the wavelength formed over the photodiodes on the integrated circuit, with the filter means has a diversity of passbands associated with different cells in a the group. Charge sense-amplifiers are closely associated with the color detector cells, and there are separate signal paths for the plurality of detector cells within each picture element group, such a scheme ensuring that individual color information is not lost.

An integrated circuit in accordance with this invention functions as an image detector, the integrated circuit. A two-dimensional array of rows and columns of color detector cells with the cells are formed into groups of at least three detector cells.

Preferably, each of the detector cells has a photodiode and transistors for writing signals to and reading signals from the photodiode.

Preferably, each cell in a group of the detector cells are associated with a set of passband filter means for selectively detecting electromagnetic radiation within a different range of bands of electromagnetic information.

Preferably, each of the cells includes means for sensing incident electromagnetic radiation of a plurality of predetermined ranges of electromagnetic wavelengths by virtue of an associated passband filter means for the wavelength formed over the photodiodes on the integrated circuit, with the filter means has a diversity of passbands associated with different cells in a group.

Preferably, the filter means comprises a set of filter elements formed over each cell in a group of cells.

An integrated circuit wherein the filter means comprises a set of passband filter elements formed over each cell with a first set of filter elements cells with a first color range of filters laminated between a first transparent layer and a second transparent layer, a second set of filter elements cells with a second color range of filters laminated between a second transparent layer and a third transparent layer, a third set of filter elements cells with a third color range of filters laminated between a third transparent layer and a fourth transparent layer.

In accordance with this invention, an integrated circuit functions as an image detector. The integrated circuit comprises a two-dimensional array of rows and columns of color detector cells with the cells are formed into groups of at least three detector cells. Each of the detector cells has a photodiode and transistors for writing signals to and reading signals from the photodiode. The cells are covered with an adjustable passband filter means for sequentially varying the electromagnetic radiation within a different range of bands of electromagnetic information as a function of time. Each of the cells includes means for sensing incident electromagnetic radiation. Means are provided for multiplexing the detected signals from the cells to provide multiple electrical passband output signals from the cells.

In accordance with this invention a camera system comprising integrated circuits as described above wherein at least two separately positioned integrated circuit image detectors allow a three-dimensional image to be captured, by a means selected from:

a) detecting phase information of the incident image on each image detector b) using means employing triangulation to detect the three dimensional position of a colored object and c) a combination of detecting phase information and triangulation.

In accordance with another aspect of this invention, a method is provided for forming an integrated circuit which functions as an image detector formed on a lightly doped P-semiconductor substrate by the series of steps of forming a gate oxide layer on the substrate, forming a blanket layer of polysilicon on the substrate, patterning the polysilicon layer into a set of gate electrodes, forming a photodiode cell with a common drain region between a set of the gate electrodes and a pair of source regions adjacent to the gate electrodes by ion implantation in the substrate, with the drain region and the substrate forming a PN photodiode, and forming a radiation passband filter over the photodiode.

Preferably, the passband filter is formed by forming a set of transparent layers over the device with a passband filter located over the photodiode; and a lenslet is formed over the passband filter.

Preferably, the cells are formed into groups of at least three adjacent photodetector cells and a set of different passband filters is formed for each the group of cells by forming a set of transparent layers over the device with a different passband wavelength range filter located over different ones of the photodiodes, and a lenslet is formed over each of the passband filters; the cells are formed into a two-dimensional array of rows and columns of color detector cells with the detector cells are associated with passband filter means for selectively detecting electromagnetic radiation within a plurality of bands of electromagnetic information; and each of the cells includes means for sensing incident electromagnetic radiation of a plurality of predetermined ranges of electromagnetic wavelengths by virtue of associated passband filter means for the wavelength formed over the photodiodes on the integrated circuit, with the filter means has a diversity of passbands associated with different cells in a the group, wherein the circuit is implemented in a technology selected from the group consisting of CMOS, PMOS, NMOS, BiCMOS and BiMOS technologies.

Preferably, the passband filter is formed by a variable wavelength passband filter located over the photodiode. Preferably, the cells are formed into a two-dimensional array of rows and columns of color detector cells with the detector cells are associated with passband filter means for selectively detecting electromagnetic radiation within a plurality of bands of electromagnetic information. Each of the cells includes means for sensing incident electromagnetic radiation of a plurality of predetermined ranges of electromagnetic wavelengths by virtue of associated passband filter means for the wavelength formed over the photodiodes on the integrated circuit, with the filter means has a diversity of passbands associated with different cells in a the group, wherein the circuit is implemented in a technology selected from the group consisting of CMOS, PMOS, NMOS, BiCMOS and BiMOS technologies.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Detailed Description of the Invention

Color Camera Chip

Figure 1:
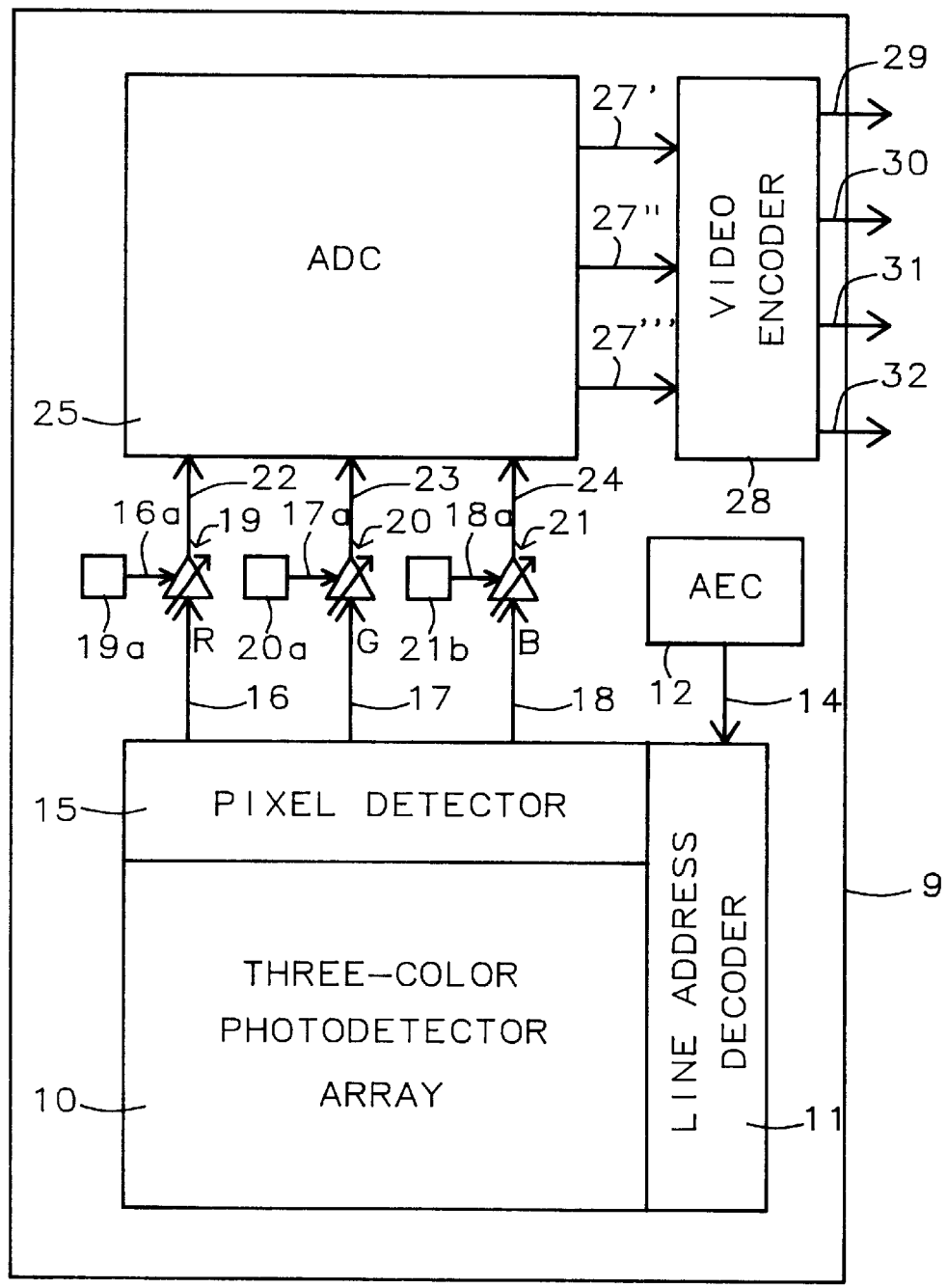
FIG. 1 is a block diagram of an integrated-circuit color camera chip in accordance with this invention including a three color photodetector array.

In FIG. 1, a block diagram is shown for an integrated-circuit, color camera chip 9. The chip 9 includes a three-color photodetector pixel array 10 which possesses color sensitivity and employs grouping of closely-adjoined light-detecting cells 10' (seen in FIGS. 2A and 2B) incorporating a plurality of color filters, which are associated with photodiodes PD (FIGS. 2A and 2B) to provide color sensitivity. A line address decoder 11 is provided to address the pixel array 10. AEC (Automatic Exposure Control) block 12 provides a timing signal on line 14 which determines the duration of exposure of the pixel array before the image projected thereon is read in each cycle.

A pixel detector 15 is connected to the output of the cells in the pixel array 10 for providing output on red output line 16, green output line 17 and blue output line 18. Separate signal paths are provided between the array 10 and the pixel detector 15 for each color information signal, so that color differentiation can be carried to the external read device, which is connected to lines 29, 30, 31 and 32. Red output line 16 from pixel detector 15 is connected to the input of red adjustable color balance amplifier 19. Green output line 17 from pixel detector 15 is connected to the input of green adjustable color balance amplifier 20. Blue output line 18 from pixel detector 15 is connected to the input of blue adjustable color balance amplifier 21. The output line 22 of red amplifier 19, the output line 23 of green amplifier 20 and the output line 23 of blue amplifier 21 are connected to red, green and blue inputs to the ADC (Analog-to-Digital Converter) block 25.

The color balance amplifiers 19, 20 and 21 are closely-associated with each color-detector cell or with each column of detector cells which detect a particular color. This is necessary because of the weak strength of the residual charge from the exposed photodiodes PD in the photodetector array 10 (which is in the order or tens of femtocoulombs). Amplifiers providing this function are seen in FIG. 4 of copending U.S. application Ser. No. 08/615,460 filed Mar. 14, 1996 now U.S. Pat. No. 5,781,233 of Liang Jie and Siang-Tze Wee for "MOS FET Camera Chip and Methods of Manufacture and Operation Thereof".

The color balance amplifiers 19, 20 and 21 provide an on-chip color balancing scheme, in which the strength of each color signal may be adjusted using coefficients which are hardwired. Alternatively they can be temporarily loaded onto chip memory which comprises gain setting registers 19a, 20a and 21a connected via lines 16a, 17a, and 18a to provide input signals to charge color balance amplifiers 19, 20 and 21.

The ADC 25 has output line 27' which carries a digitized red signal, output line 27" which carries a digitized green signal and output line 27'" which carries a digitized blue signal. The ADC 25 takes the input signals on lines 22, 23, and 24 and processes them from the three RGB analog signals into three corresponding RGB digital signals provide on line(s) 27', 27", and 27'".

Output lines 27', 27", and 27'" are connected to the input of video encoder block 28 which processes the digital data to yield luminance signals on output line 29.

There are chrominance signals on output line 30 with composite signals on output line 31. There are RGB/YUV (Red-Green-Blue)/(Y (luminance) U=0.492 (blue'-luminance) V=0.877 (Red' luminance) signals on output line 32. The video encoder 28 receives RGB signals in an analog/digital format,
Standard:
PAL (Phase Alternation Lines) which implements a line-by-line reversal of the phase of a color signal component NTSC (National Television System Committee) SECAM (SEquentiel Couleur Avec Mémoire)

Figure 5A:
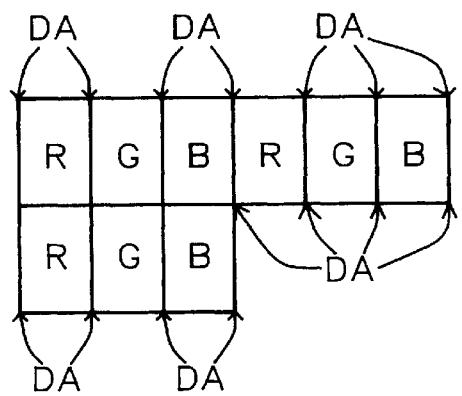
FIG. 5A shows an orthogonal arrangement of three sets of R-G-B detector cells which leaves dead areas between cells from left to right and top to bottom.

FIG. 5A shows an orthogonal arrangement of three sets of R-G-B detector cells which leaves dead areas DA between cells from left to right and top to bottom. To avoid the problems presented by the dead areas, an arrangement of hexagonal dispersion of detector cells is provided.

Figure 5B:
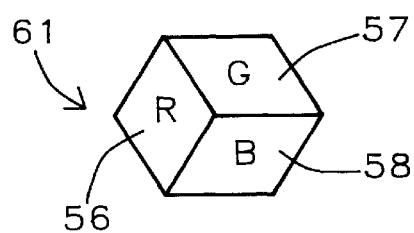
FIG. 5B shows an arrangement of hexagonal dispersion of detector cells in accordance with this invention with the photodiode detector array divided into an RGB triplet. The cells in the triplet shown in FIG. 5B are similar, except that each is associated with a color filter of a different color.

FIG. 5B shows a unit set 61 of red, green, and blue cells 56, 57 and 58 with respectively are shown having diamond shapes rotated by 120° to form an overall equilateral hexagon, filling the spaces in between.

The photodiode detector array 10 is divided into triplets shown in FIGS. 3, 5B, 5C and 6. The cells 56, 57 and 58 in a triplet shown in FIG. 5B are similar, except that each is associated with a color filter of a different color. Hence, each cell in a polychrome triplet such as that shown in the a sectional view in FIG. 3 in cells 61 and 62 in an array of sensors 42A–42E in device 40 has red filters 49, 49', a blue filter 48 or green filters 50, 50' in a three color system such as the RGB (Red-Green-Blue) system. The proximity and small size of the cells in such a polychrome triplet 41 allows each cell to differentiate, accurately, the color components for each picture element of the detected image.

Referring to FIG. 1, this color information is adjusted on the chip 9 for color, for brightness and for contrast before being sent to an external read device or an external display device. The color filter is a series of passive layers such as a red filter 49, 49', a blue filter 48 or a green filter 50, 50' sandwiched between transparent dielectric layers 43, 44, 45, 46, and 47 on the integrated circuit surface which permits the selective transmission of light or electromagnetic radiation of certain frequency ranges.

The filter materials are coated onto the semiconductor substrate 41 after the latter has undergone conventional MOS processing steps as will be described below.

Figure 5C:
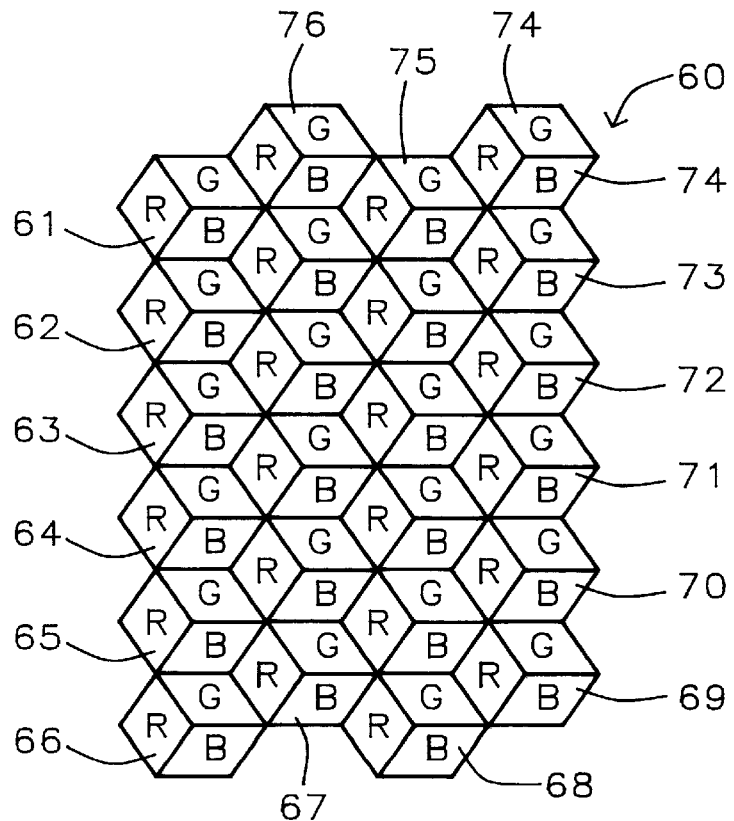
FIG. 5C shows an example of group staggering of the type of cell shown in FIG. 5B. A group of detector cells has a layout of a regular hexagon. Thus, the matrix array is arranged as a "honeycomb" of such groups of a group of cells based on a detector cell. The concept of cell staggering may also be applied to black and white image detector arrays.

FIG. 5C shows a group of detector cells 61–76, providing an example of staggering of a group of the type of cells shown in FIG. 5B with the layout of a regular hexagon, which is described further below.

Figure 6:
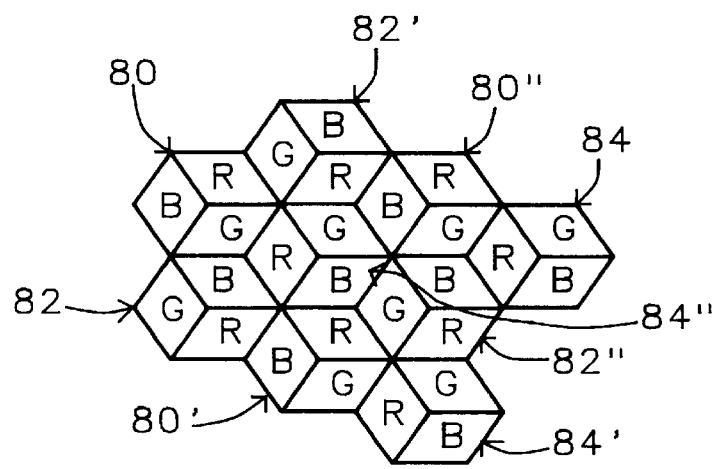
FIG. 6 shows a plurality of hexagonal clusters arranged with one cluster per pixel.

FIG. 6 shows a plurality of hexagonal clusters arranged with one cluster per pixel. The sets of clusters 80, 80' 80", 82, 82', 82", 84, 84', 84" are provided with one cluster per pixel. Each cluster 80, 80' 80", 82, 82', 82", 84, 84', 84" is composed of three diamond shaped RGB cells in each cluster which are arranged into a composite arrangement of the cells packed into a compact structure.

Pixel Array Photosensor Cell

Referring to FIGS. 2A–2D, in accordance with this invention, in order to simplify the decoding and timing logic, reading and writing to each photodiode PD in a pixel array cell 10' is achieved by having more than one transistor $T_a$ and $T_b$ associated with the photodiode PD. In a typical MOS implementation, this scheme is realized by using transistors that share a common diffusion area D as their drains. The diffusion area D functions at the interface with the substrate (or well) 35 as the photodiode PD. In a contemporary 0.6 μm process, the additional gate and source area required by having the two transistors $T_a$ and $T_b$ does not significantly increase device size, since the additional areas required for the transistors $T_a$ and $T_b$ are significantly smaller than the common drain-diffusion area.

The invention seeks to reduce parasitic signals and to simplify read and write decoding logic by associating more than one transistor with each photodiode PD. In this MOS implementation, such a scheme is realized as shown in FIG. 2B by using transistors $T_a$ and $T_b$ that share the common diffusion region D in P-substrate 35. A portion of the diffusion region D functions with substrate 35 as the photodiode PD. In the conventional 0.6 μm process, the additional gate and source area required by having two transistors does not significantly increase device size, since these additional areas are significantly smaller than the common diffusion area. For more complicated designs, it may be useful to have more than two transistors associated with each photodiode PD. The design of FIGS. 2A and 2B provides multiple read or write paths to the photodiode PD.

Figure 2A:
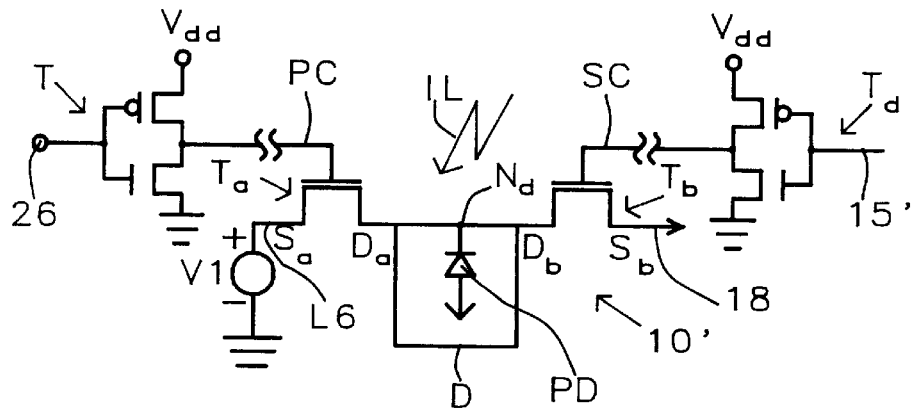
FIG. 2A is an electrical schematic diagram of a portion of a single photosensor cell in accordance with this invention which is a component of the three color photodetector array of FIG. 1.
Figure 2B:
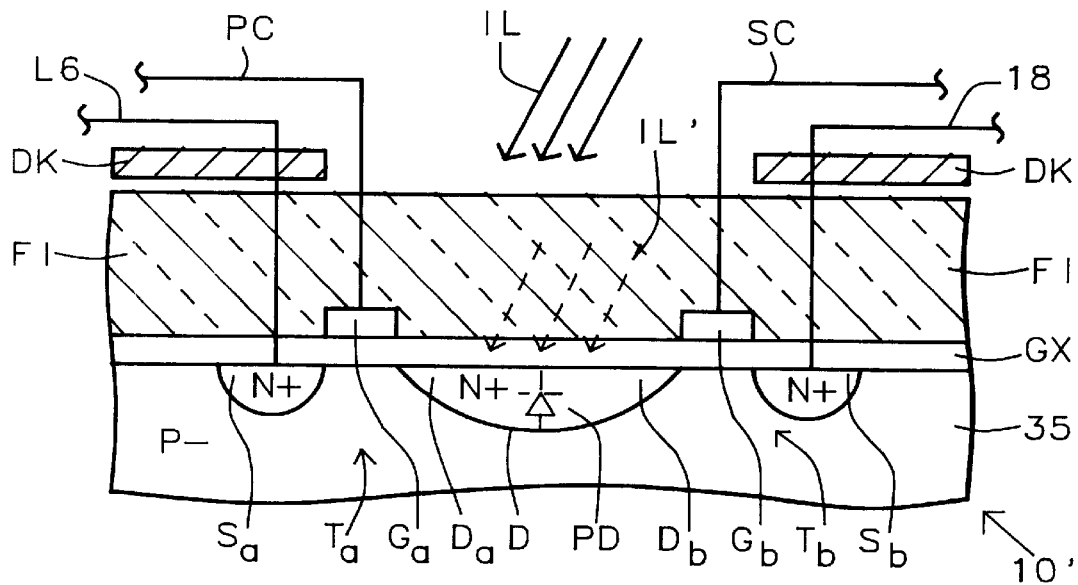
FIG. 2B is a partially schematic, sectional view of an embodiment of the cell of FIG. 2A, which is formed on a P-doped silicon semiconductor substrate.

FIG. 2A is an electrical schematic diagram of a portion of a single photosensor cell 10' in accordance with this invention, which is the preferred embodiment of this invention. Cell 10' is a component of the three color photodetector array 10 of FIG. 1.

FIG. 2B is a partially schematic, sectional view of an embodiment of the cell 10' of FIG. 2A, which is formed on a P− doped silicon semiconductor substrate 35 having a surface covered by a conventional dielectric layer GX comprising a silicon dioxide gate oxide (oxide) layer. The cell 10' includes MOS transistors $T_a$ and $T_b$ and an incident-light-sensor in the form of the photodiode PD formed in and on the P− doped silicon semiconductor substrate 35.

Referring to FIG. 2A, photosensor cell 10' serves as a detector for one pixel in the array of cells represented by photodetector pixel array 10 (PPA) in FIG. 1. Cell 10' comprises two MOS transistors $T_a$ and $T_b$ and the photosensor which comprises photodiode PD. In FIG. 2A, the drain $D_a$ of the first transistor $T_a$ and the drain $D_b$ of the second transistor $T_b$ are both connected at node $N_d$ to the cathode (N type region) of the photodiode PD. The photodiode PD is a conventional photodiode formed by a P-N junction which is operated under reverse bias. When an optical signal IL energizes the photodiode PD, the depletion region in the diode PD separates photogenerated electron-hole pairs, and an electric current flows in the external circuit from node $N_d$ to ground in the conventional manner of operation of a photodiode. The anode of the photodiode PD is connected to ground.

The negative terminal of D.C. power supply, voltage source V1 (+3.0 Volts) is connected to ground. The positive terminal of voltage source V1 is connected via line L6 to the source $S_a$ of first transistor $T_a$, so that when the control gate electrode (gate) of the first, precharge control transistor $T_a$ rises, the voltage V1 is applied to node Nd, which will precharge the node Nd to an initial voltage V1, by means of showing a finite quantity of charge at node Nd. The gate of control transistor Ta is connected to line PC which is connected to the junction of the S/D circuits of transistors Tc and Tc'. To operate the first, control transistor Ta, the gate of transistor Ta is controlled via transistors Tc and Tc' by a logic signal on line 26 from precharge timing control circuit 25 of the kind shown in copending United States patent application of Liang Jie and Wee Siang-Tze (TMI95-001) for MOS FET CAMERA CHIP AND METHODS OF MANUFACTURE AND OPERATION THEREOF, Ser. No. 08/615,460 filed Mar. 14, 1996, now U.S. Pat. No. 5,781,233 The precharge control voltage $V_{PC}$ at the gate of control transistor Ta is described below in connection with the description of FIG. 2C.

The precharge control voltage $V_{PC}$ serves as the "write" control of the device 10'. The sensing control voltage $V_{SC}$ serves as the "read" control of the photosensor cell 10'. The gate of control transistor Tb is controlled via transistors Td and Td' by a logic signal on line 15' which provides a connection from line address decoder 11 in FIG. 1. The voltage level $V_{SC}$ at the gate of transistor Tb is described below in connection with the description of FIG. 2D.

Figure 2C:
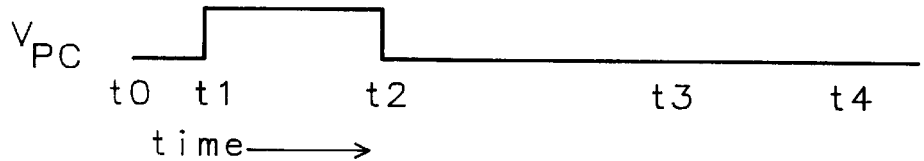
FIG. 2C is an idealized diagram illustrating the trace of the precharge control voltage $V_{PC}$ amplitude of the photosensor cell of FIGS. 2A and 2B shown varying as a function of time.

FIG. 2C is an idealized diagram illustrating the trace of the precharge control voltage $V_{PC}$ amplitude shown varying as a function of time. Voltage $V_{PC}$ repeats in a cyclical pattern at the repetition rate of the photosensitive pixel array 10, as will be well understood by those skilled in the art.

In FIG. 2C, starting at time t0, the voltage $V_{PC}$ remains at a quiescent value near zero and then at time t1, $V_{PC}$ rises sharply in a square wave to a positive voltage which persists from time t1 to time t2 which positive voltage turns on first control transistor Ta so that it conducts current from voltage source V1. At time t2, the voltage $V_{PC}$ drops sharply back to near zero turning control transistor Ta off again.

The control gate electrode (gate) of the second, sensing control transistor Tb is controlled via transistors Td and Td' by the logic signal on line 15'. Line 15' connects to the line address decoder 11 to provide the sensing control voltage to the photosensor cell 10' in pixel array 10.

Figure 2D:
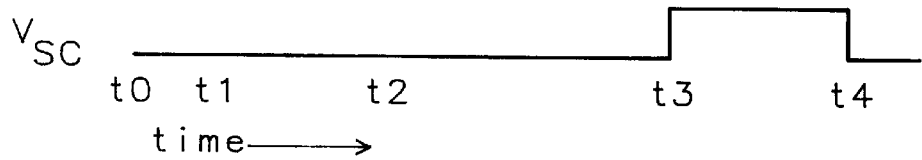
FIG. 2D shows an idealized diagram illustrating the voltage amplitude trace of sensing control voltage $V_{SC}$ of the photosensor cell of FIGS. 2A and 2B varying as a function of time.

FIG. 2D is an idealized diagram illustrating the voltage amplitude trace of sensing control voltage $V_{SC}$ varying as a function of time. The same times t0, t1, t2 and t3 shown in FIG. 2C are indicated below the trace. Voltage $V_{SC}$ also repeats in a cyclical pattern at the repetition rate of the photosensitive pixel array 10, as will be well understood by those skilled in the art. FIG. 2D has the same time coordinates as FIG. 2C to show the time delay between the pulses which energize the gates of the control transistors Ta and Tb.

When the time arrives for reading the voltage in a given cell 10', the voltage $V_{SC}$ rises sharply in a square wave to a positive value which persists from time t3 to time t4, to turn on transistor $T_b$. After time t4, the voltage $V_{SC}$ drops sharply back to zero thereby turning off transistor $T_b$. Note that time t3 occurs a substantial time interval after time t2, when voltage $V_{PC}$ drops, which gives node $N_d$ of the cell 10' a time interval during which it can be discharged because of the intervening conduction of the photodiode PD from node $N_d$ to ground, if incident light IL hits the photodiode PD. On the other hand if no light IL strikes the photodiode PD during the time from t1 to time t3, then the voltage on node $N_d$ remains high and the voltage on line 18 remains near 3 Volts, and the charge remains on node $N_d$ during the time interval t2–t3.

In practice, the residual charge on node $N_d$ after the time interval t2–t3 varies inversely with the summed intensity of the incident light thereon during the timed interval t2–t3. Line 18, which comprises a portion of cable 18C in FIG. 1, is connected from the source $S_b$ of transistor $T_b$ to a corresponding one of the pixel amplifiers 19, 20 or 21.

When an optical signal IL of radiation directed towards PPA 10 strikes cell 10' and energizes the photodiode PD, the depletion region in the diode PD separates photogenerated electron-hole pairs, and an electric current flows in the external circuit from node $N_d$ to ground in the conventional manner of operation of a photodiode PD. The anode of the photodiode PD is connected to ground. The negative terminal of D.C. power supply voltage source V1 (+3.0 Volts) is also connected to ground. The positive terminal of voltage source V1 is connected via line L6 to the source $S_a$ of first control transistor $T_a$, so that when the control gate electrode (gate) of the first, precharge control transistor $T_a$ rises, the voltage V1 is applied to node $N_d$, which will precharge the node $N_d$ to an initial voltage V1, by means of showing a finite quantity of charge at node $N_d$. The gate of control transistor $T_a$ is connected to line PC which is connected to the junction of the drains of a PMOS transistor $T_c$ and an NMOS transistor $T_c$'. The source of PMOS transistor $T_c$ is connected to bias voltage $V_{DD}$ and the source of NMOS transistor $T_c$' is connected to ground. To operate the first, control transistor $T_a$, the gate of transistor $T_a$ is controlled via application to the gates of transistors $T_c$ and $T_c$' of a logic signal on line 26 from precharge timing control circuit 25. The precharge control voltage $V_{PC}$ at the gate of control transistor $T_a$ is described below in connection with the description of FIG. 2C, below.

The precharge control voltage $V_{PC}$ serves as the "write" control of the cell 10'. The sensing control voltage $V_{SC}$ serves as the "read" control of the photosensor cell 10'. The gate of control transistor $T_b$ is connected to line PC to be controlled which by the voltage at the junction of the drains of PMOS transistor $T_d$ and a NMOS transistor $T_d'$. The source of PMOS transistor $T_d$ is connected to bias voltage $V_{DD}$ and the source of NMOS transistor $T_d'$ is connected to ground. The gates of PMOS transistor $T_d$ and NMOS transistor $T_d'$ are connected to be controlled by a logic signal on line 15' from the line address decoder 11. The voltage level $V_{SC}$ at the gate of transistor $T_b$ is described below in connection with the description of FIG. 2D.

FIG. 2B shows the sensor cell 10' of FIG. 2A in an MOS n-channel photodiode implementation.

The transistors $T_a$ and $T_b$ and the photodiode PD share a common, N+ doped, drain region D in the substrate 35. The common drain region D includes the drain $D_a$ of the first transistor $T_a$, the N region (cathode) of the PN photodiode PD, and the drain $D_b$ of the second transistor $T_b$. The common, N+ doped, drain region D (which was formed by diffusion) is left exposed through gate oxide layer GX and through optical filter FI (which is for example a red, blue or green color filter [which can also be a lens if it is contoured appropriately). Thus, the portion of the spectrum in incident light IL which passes through the filter FI reaches the photodiode PD to operate it as a photodiode element. The P region of P-N photodiode PD comprises the P-substrate 35. A voltage source V1 (with a value of +3 Volts) shown in FIG. 2A is connected via line L6 to the source $S_a$ (formed in substrate 35) of transistor $T_a$. The source $S_b$ (formed in substrate 35) of transistor $T_b$ is connected by line 18 to a line in cable 18 connected to the pixel column amplifier 19. The other end of power supply V1 is connected to ground.

Using a control gate mask, the polysilicon layer is etched to form the two control gate electrodes $G_a$ and $G_b$. Using a conventional ion implantation mask (not shown) with an opening over the control gate electrodes $G_a$ and $G_b$, an N+ ion implantation process is performed to implant into the source regions $S_a$ and $S_b$ and the drain region $D_a$, D, $D_b$ in a self-aligned process using the gates $G_a$ and $G_b$ to define the edges of the implanted regions in a conventional N+ ion implanting process.

The source regions $S_a$ and $S_b$ and the drain region $D_a$, D, $D_b$ are ion implanted with an N type arsenic or phosphorus ions with a dosage of from about 1 E 15 ions/cm$^2$ to about 5 E 15 ions/cm$^2$, (preferably 3 E 15 ions/cm$^2$) implanted at an energy of from about 50 keV to about 100 keV in an implanter tool. The resulting concentration of regions $S_a$ and $S_b$ and the drain region $D_a$, D, $D_b$ is present in a high concentration level from about 1 E 19 atoms/cm$^3$ to about 1 E 21 atoms/cm$^3$.

Transistor $T_a$ includes control gate Ga formed over gate oxide layer GX which, in combination with source region $S_a$ and drain region $D_a$ in substrate 35, forms the MOSFET device $T_a$. Control gate $G_a$ is connected to precharge control line PC. Transistor $T_b$ includes control gate $G_b$ formed over gate oxide layer GX and a source region $S_b$ and the drain region $D_b$ in substrate 35 to form the MOSFET device $T_b$. Control gate $G_b$ is connected to precharge control line SC.

One or more opaque, metal masking layers DK covers the remainder of the cell 10' covering the exposed surface of the gate oxide layer GX (not covered by the gate electrodes or the filter FI) and a portion of the control electrode gates $G_a$ and $G_b$ of transistors $T_a$ and $T_b$.

The optical filter FI comprises an inert, transparent dielectric material such as an acrylate or other polymers) mixed with a colored dye which filters out unwanted light. This refers to a material selected from the group consisting of methacrylate, poly(methyl methacrylate) (PMMA), poly (glicidyl methacrylate-co-ethyl acrylate) called cop formed by which is deposited on the device. Input light IL passes through filter FI and is received as transmitted light IL' at the photodiode PD.

It can be seen that line L6 reaches down through the masking layer DK and gate oxide layer GX to contact the source $S_a$, and that line 18 reaches down through the masking layer DK and gate oxide layer GX to contact the source $S_b$. Line 18 which comprises a portion of cable 18C in FIG. 1 is connected from the source $S_b$ of transistor $T_b$ to the input of one of the amplifiers in pixel column amplifier unit 19.

The dimensions of photodiode PD viewed from the surface of the substrate 35 fall within a range of widths of between about 105 $\mu$m and about 115 $\mu$m and an equal range of lengths of about 105 $\mu$m and about 115 $\mu$m. The capacitance is between about 20 femtoFarads and about 50 femtoFarads. The leakage current is preferably between about 1 nanoAmpere and about 40 nanoAmperes.

The integrated circuit 10' functions as an image detector which provides an output signal representing the detected image with a two-dimensional array of groups of sensor cells, wherein each of said sensor cells has a photodiode and a pair of transistors for writing to and reading from said photodiode. The cell sensing incident electromagnetic radiation, and sense-amplifiers are associated with said cells.

When using a R-G-B system of color analysis, blue-color, red-color and green-color detector cells (MOS), n-channel photodiode implementations are required.

Method of Manufacture

Figure 4A:
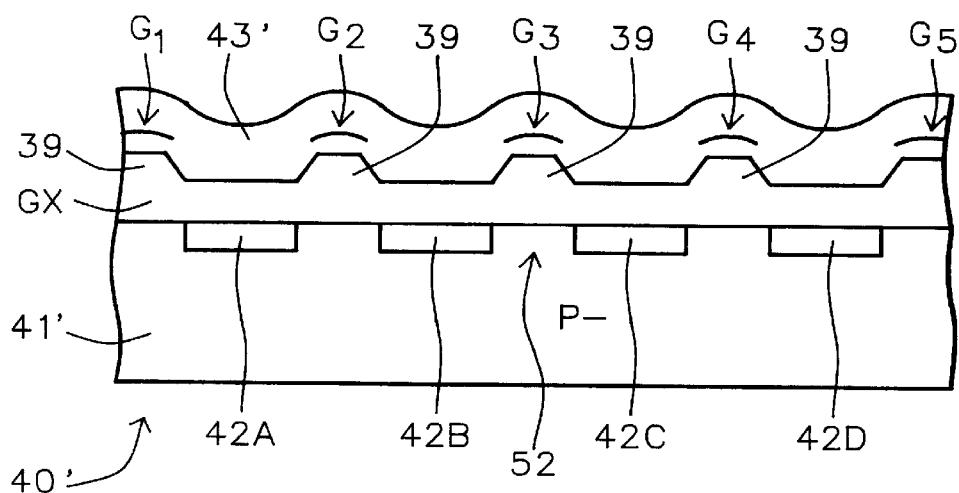
FIGS. 4A–4H illustrate a process of manufacture in accordance with this invention of devices similar to the one shown in FIG. 2B.

Referring to FIG. 4A a sectional view device 40' similar to the devices shown FIG. 2B is preferably manufactured starting with a P− semiconductor region 41' which comprises the substrate or a P-well region in the substrate with photosensitive regions 42A, 42B, 42C, and 42D, therein. Covering the top surface of region 41' and including regions 42A, 42B, 42C, and 42D is formed a conventional thin film of a gate oxide layer GX of an oxide of silicon is formed to a thickness of 100 Å to about 300 Å by a conventional process such as thermal oxidation at a temperature between about 800° C. and about 900° C.

The gate oxide layer GX is thicker in regions 39 between the photosensitive regions 42. Above the regions 39 a blanket gate electrode layer of conductive, doped gate electrode polysilicon was formed over which a conventional type of control gate mask (not shown) was formed.

The doped gate electrode polysilicon was first applied as a blanket layer of polysilicon in a conventional manner to a thickness of between about 1,000 Å and about 6,000 Å. Preferably, the polysilicon comprises a heavily doped layer of polysilicon formed by thermal reduction of of $SiHCl_3$ in hydrogen or by thermal decomposition of silane $SiH_4$ in a reactor between about 600° C. and 650° C. at 0.2 to 1.0 Torr using 100% silane or a diluted mixture of 20–30% silane in nitrogen at about the same pressure doped by conventional means. Using the control gate mask, the polysilicon layer is etched to form the five control gate electrodes $G_1$, $G_2$, $G_3$, $G_4$, and $G_5$, among many others (not shown.) Using a conventional ion implantation mask (not shown) with an opening over the control gate electrodes $G_a$ and $G_b$, an N+ ion implantation process is performed to implant into the source regions and the drain region in a self-aligned process using the control gate electrodes $G_1$, $G_2$, $G_3$, $G_4$, and $G_5$ to define the edges of the implanted regions in a conventional N+ ion implanting process.

The source regions and the drain regions (not shown in FIGS. 4A–4H) are ion implanted, as described above in connection with FIG. 2B. Then a transparent dielectric layer 43' is formed over the control gate electrodes $G_1$, $G_2$, $G_3$, $G_4$, and $G_5$.

The electrical connections lines L6 and 18 are connected to the source regions $S_a$ and $S_b$ respectively and connections lines PC and SC are connected to the gate electrodes $G_a$ and $G_b$ in a conventional manner.

Figure 3:
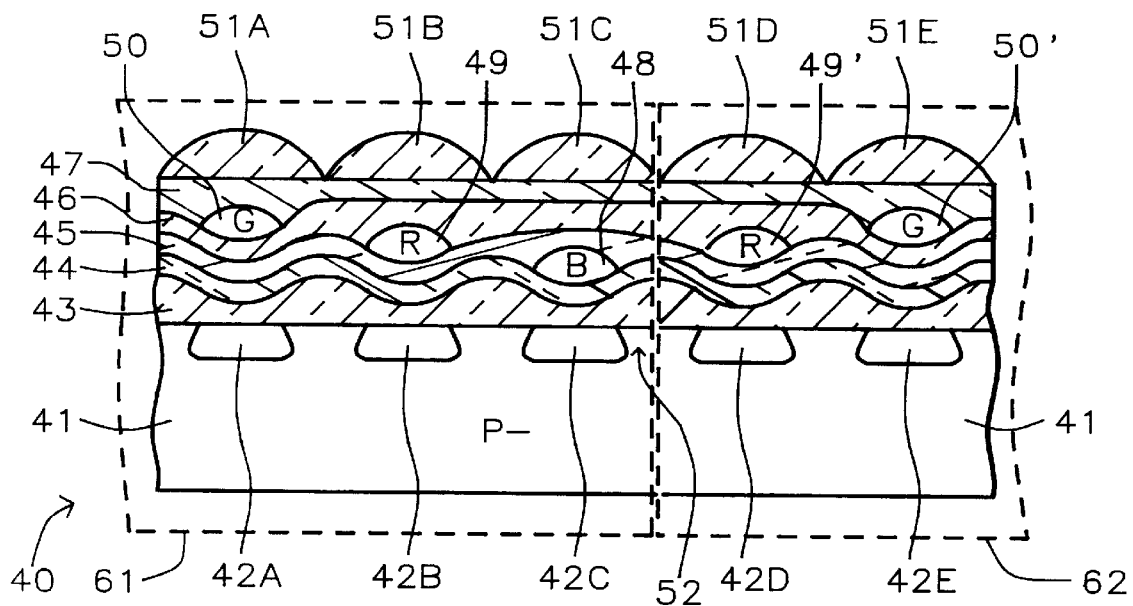
FIG. 3 shows a sectional view of an array of sensors with each cell comprising a portion of a polychrome triplet with red, blue and green filters a three color system such as the RGB (Red-Green-Blue) system.

Each set of cells 42A, 42B and 42C in a polychrome triplet 40' such as that shown in FIG. 3 has red filters 49, 49', a blue filter 48 or green filters 50, 50' in a three color system such as the RGB (Red-Green-Blue) system. The left three detectors 42 in FIG. 3 are a triplet with a set of B-R-G filters 48, 49 and 50 and mini-lenses referred to hereinafter as lenslets. The proximity and small size of the cells in such a polychrome triplet 48, 49, 50 allows each cell to differentiate, accurately, the color components for each picture element of the detected image. An example of a dead area 52 is shown between cells 42C and 42D.

Over the basic FET devices is the transparent layer 43' composed preferably of silicon dioxide formed by oxidation in a standard MOS process. The layer 43' is formed in a wavy surface with a pattern of hillocks and valleys. This surface is depressed above the photosensitive areas because these areas are not covered by polysilicon or metal. The valleys in layer 43' are low points above the photodetector cells 42A, 42B, 42C, 42D and 42E. The hillocks are high points of layer 43' located half way between the cells 42A, 42B, 42C, 42D and 42E.

Figure 4B:
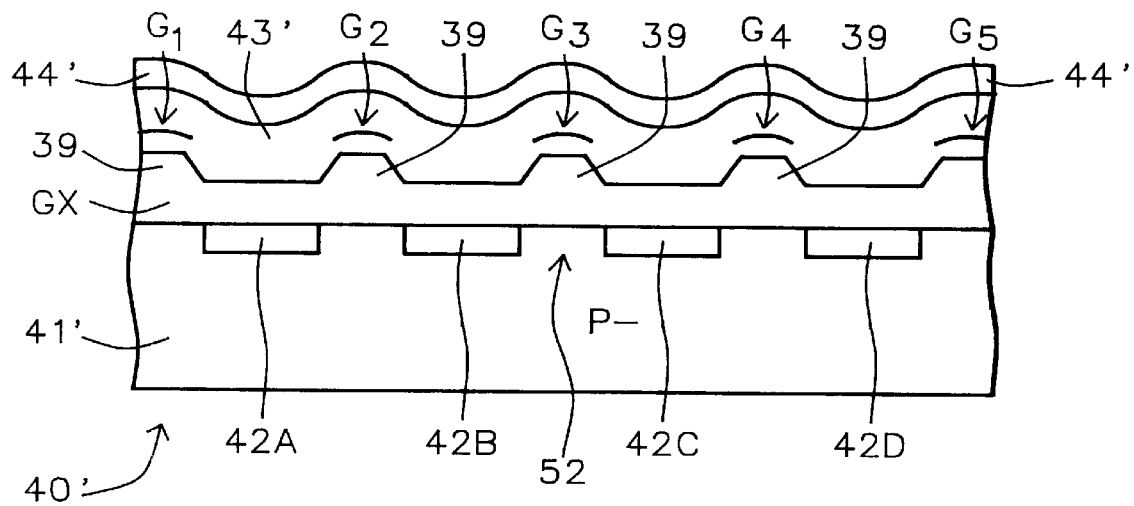

FIG. 4B shows the device 40' of FIG. 4A after a second, transparent dielectric layer 44' has been applied over the dielectric layer 43'. The second transparent, PMMA layer 44' is formed over first transparent layer 43', which has a thickness of between about 20 Å and about 500 Å is deposited. There are identical hillocks and valleys formed in the second transparent PMMA layer 44' in the same pattern as those formed in layer 43', since layer 44' is of uniform thickness.

Before describing the next step in the process it is helpful to understand that the color of the filters R-G-B is provided by a process of using iron (III) sulfate for R, chromium (111) nitrate for G and tetraamino copper (II) sulfate for B diffused into the aluminum (III) oxide by absorption of aluminum (III) oxide layer.

Figure 4C:
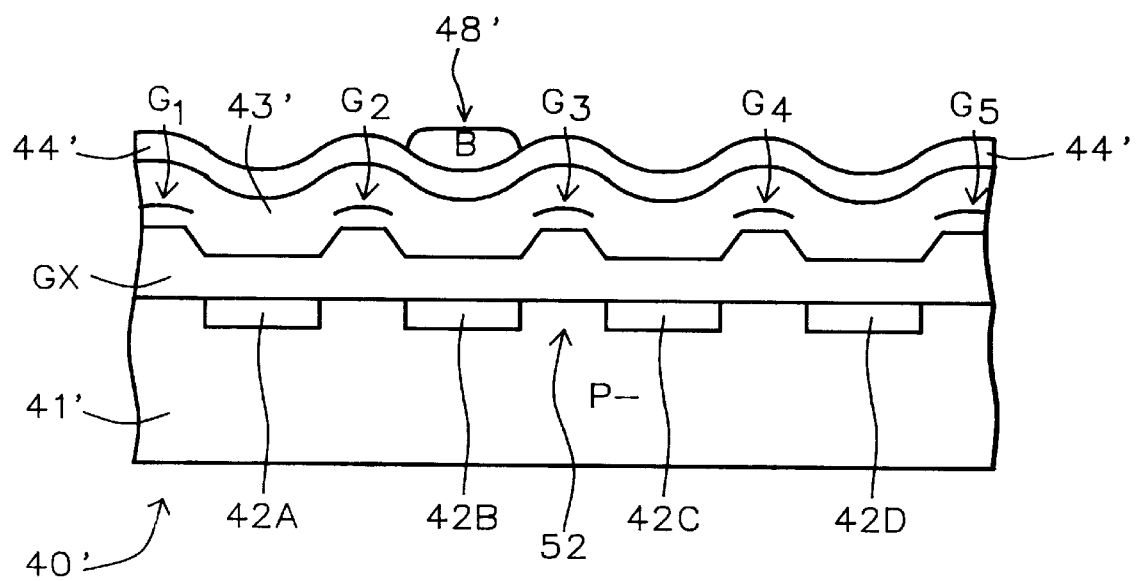

FIG. 4C shows the device 40' of FIG. 4B after an aluminum (111) oxide blue filter 48' is formed over layer the device in a process of blanket deposition followed by patterning in a conventional manner by removing excess portions of the filter 48' by masking and subtractive, e.g. etching techniques. In this example the blue (B) filter 48' is located between the gate electrodes G2 and G3 over the photosensitive region 42B.

Blue filter 48' is formed in one of the valleys directly above photodetector cell 42B. Blue light filter 48' passes light in the blue passband of the spectrum composed of electromagnetic waves of 400 nm–500 nm wavelength which is located in a position to intercept light (i.e. passing through a lenslet 50B as shown in FIG. 4H) towards cell 42C.

Figure 4D:
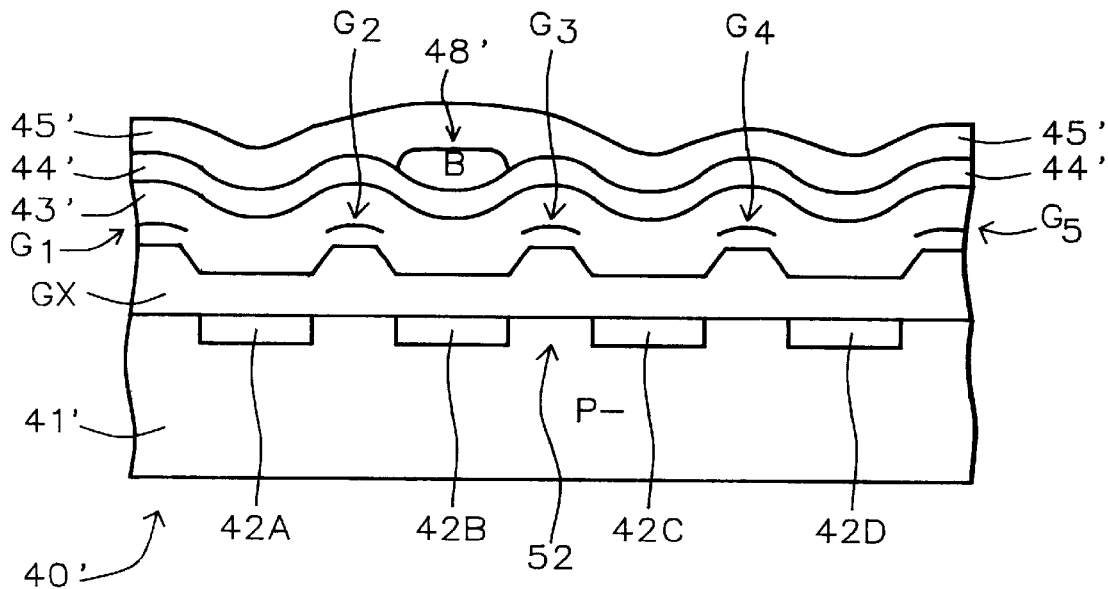

FIG. 4D shows the device 40' of FIG. 4C after blanket deposition thereon of a third transparent, PMMA layer 45', which has a thickness of between about 20 Å and about 550 Å. Layer 45' is formed in a different pattern of hillocks and valleys from those formed in layer 44', since layer 45' is of non uniform thickness with valleys formed directly above photodetectors 42A and 42C where red filters 49" and 49'" are to be formed in FIG. 4E.

Figure 4E:
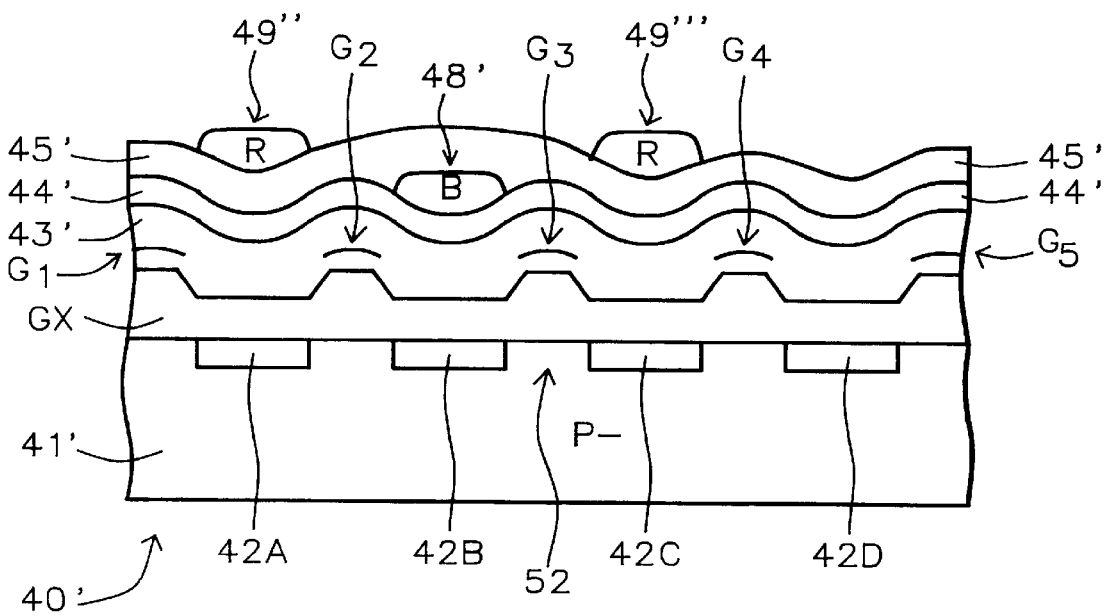

FIG. 4E shows the device 40' of FIG. 4D after formation of red filters 49" and 49'" which pass light in the red passband of the spectrum composed of 600 nm–700 nm wavelength electromagnetic waves. Red filters 49" and 49'" located in a position to intercept light passing through lenslet 51C towards cell 42C. A wide hillock is formed in layer 45' directly above blue filter 48', whereas other hillocks are formed between photodetectors 42A and 42B on the left side of device 40' and between photodetectors 42D and 42E on the right side of device 40'.

Figure 4F:
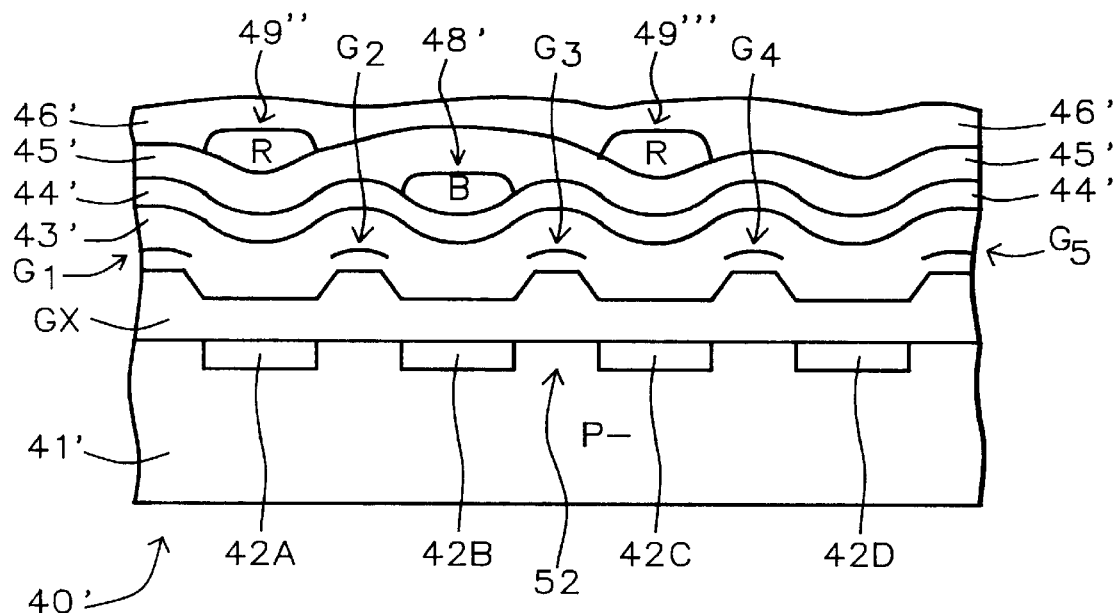

FIG. 4F shows the device 40' of FIG. 4E after formation of a fourth transparent, PMMA layer 46', which has a thickness of between about 20 Å and about 500 Å is deposited. Layer 46' is formed in a different pattern of hillocks and valleys from those formed in layer 45', since layer 46' is of a different non uniform thickness with valleys formed directly above photodetectors 42A and 42D.

Figure 4G:
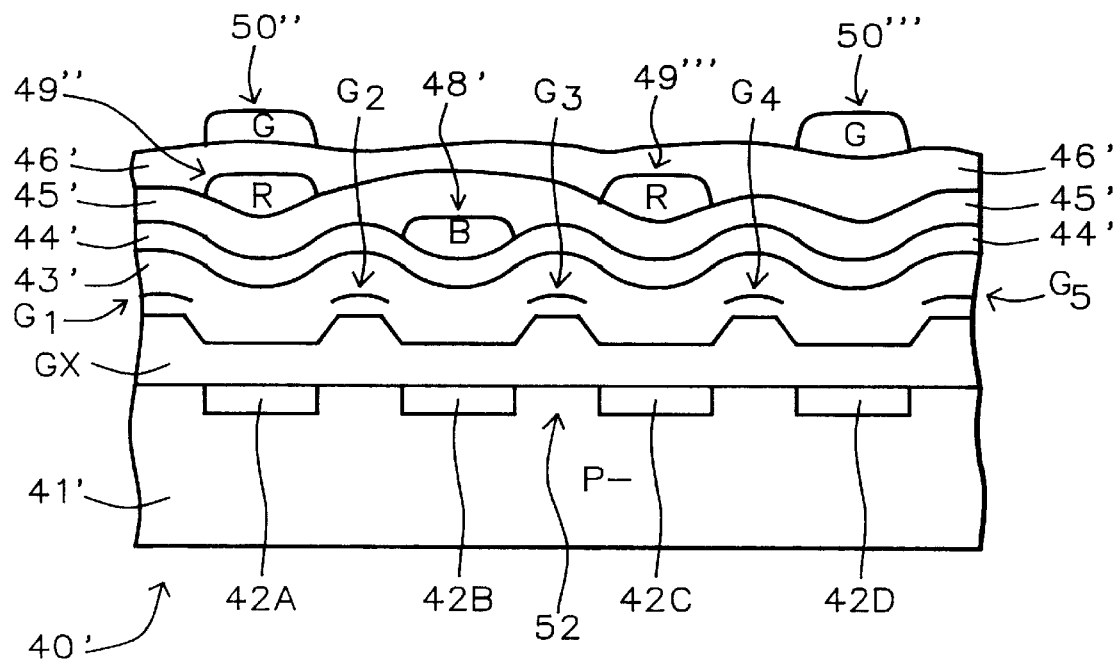
Figure 4H:
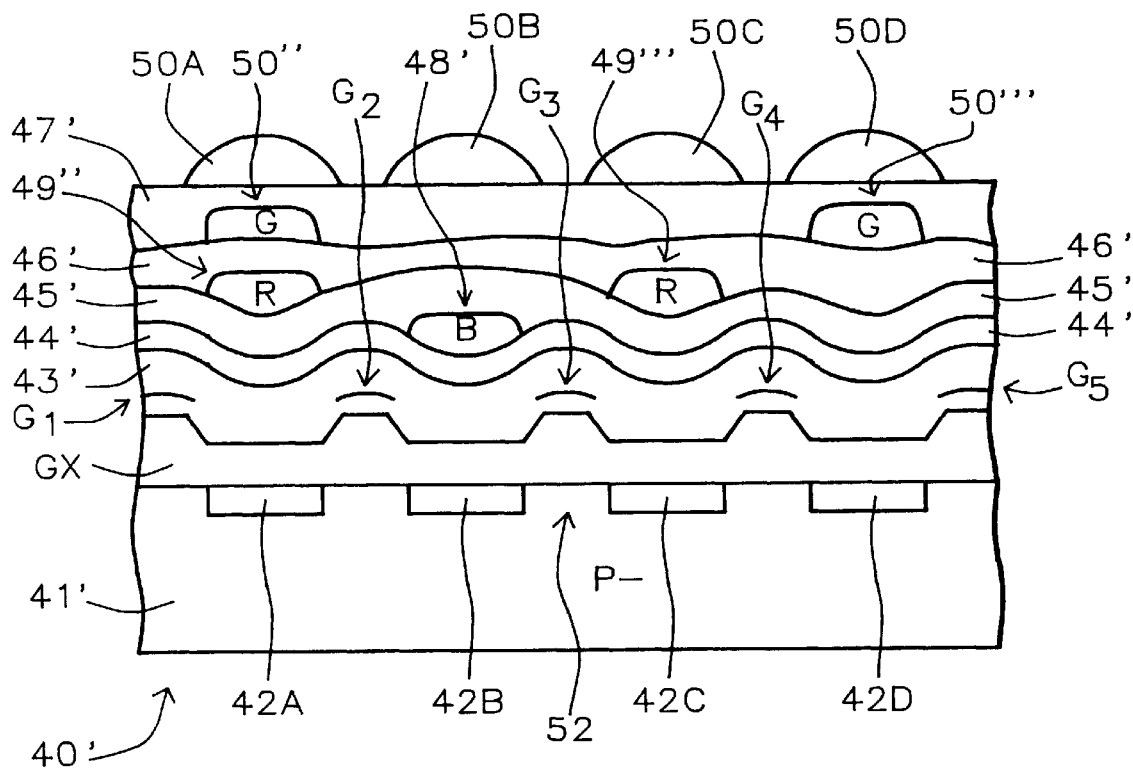

FIG. 4G shows the device 40' of FIG. 4F illustrates the step of the process of formation of green filters 50" and 50'" in the valleys directly above photodetectors 42A and 42D. Green filters 50" and 50'" are formed which pass light in the green passband of the spectrum composed of 500 nm to 600 nm wavelength electromagnetic waves. The filters 50" and 50'" are located in a position to intercept light passing through lenslets 50 Å towards cell 42A and light passing through lenslets 50D towards cell 42D. A wide hillock is formed in layer 46' extending with a relatively flat surface across red filters 49" and 49'" with hillocks formed to the right and the left sides of the portion of device 40' which is shown.

FIG. 4H shows the device 40' of FIG. 4G after formation of a fifth transparent, PMMA layer 47', which has a thickness of between about 20 Å and about 1,000 Å is deposited over green filters 50" and 50'" as well as PMMA layer 46'. Layer 47' is formed with no hillocks and valleys. Layer 47' is of non uniform thickness since it fills the valleys formed directly above photodetectors 42A and 42D covering green filters 50" and 50'".

Next, in FIG. 4H, another process step is performed in which a series of transparent lenslets 50A, 50B, 50C, and 50D are formed above layer 47 centered over the cells 42A, 42B, 42C, and 42D respectively. The lenslets 50A, 50B, 50C, and 50D are formed into partially spherical convex surfaces facing away form the substrate 41 towards a potential source of light to be detected, with one lenslet for each photodetector cell 42A, 42B, 42C, 42D, 42E, etc. in the array. The lenslets are formed by the process of deposition and etching of aluminum (III) oxide onto layer 47.

The color filters are passive layers such as a red filter 49, 49', a blue filter 48' or a green filter 50, 50' sandwiched between transparent dielectric layers 43', 44', 45', 46', and 47' on the integrated circuit surface which permits the selective transmission of light or electromagnetic radiation of certain passband ranges of light frequencies. It is important that the colored dyes used cannot react with or diffuse through the dielectric material used in layers 44', 45', 46', and 47' (e.g. PMMA.)

The layers 44', 45', 46', and 47, as well as filter materials are coated onto the semiconductor substrate 41 after the latter has undergone conventional MOS processing steps.

In this three color implementation of the invention, it is necessary to provide separate read signal paths for the three different color signals from each color detector array cell. As the residual-charge-signal from each photodiode is weak (in the order of tens of femtocoulombs) it becomes necessary to associate a precharged sense amplifier closely with each color-detector cell or with each column of detector cells which detect a particular color.

On-Chip Color Differentiation

One advantage of the on-chip color filter implementation is that neighboring or interlaced sensing cells are grouped to sense the color associated with a picture element in the image. The close proximity of the light detecting cells in the group enables the use of a single matrix-array of such cells to sense a color image. That has both the advantages of saving cost and enhancing color reproduction accuracy compared with the technique of using several separate monochrome matrix-array detectors with associated color filters. In the latter case it is difficult to ensure that exactly the same image is incident on each matrix because of the problem of different images at different locations, and that the image snapshots are detected at exactly the same sampling instances in the separate arrays.

The color filters are added to the semiconductor wafer after the latter has completed the standard integrated circuit processing steps. The process of applying the color filter coat may be handled at the processing foundry or at a separate premise.

The color filters are applied onto the wafer one color at a time. Usually, the color filters are separated by layers of a transparent and uncolored substance layer which serves to position a color filter directly above each photodiode in the light-detecting array. The separating layers must not react with the colored dye present in the colored layers.

To focus the incident light, a lenslet is added above and around each photodiode. This lenslet may be colored or uncolored, and it could have a different optical density from the uncolored layers below it. Each lenslet also serves to focus light which would otherwise fall onto layer DK and pass onto the next nearest photodiode. This reduces the effective light insensitive area of the chip surface.

Use is made of separate (or multiple) read and write paths to the photodiode in each detector cell to reduce parasitics in each path. This is important in view of the weak strength of the photodiode signals.

An object of this invention is to provide an integrated circuit which functions as an image detector which employs two transistors in a photosensor pixel array with reduced parasitics. In addition, there is a need for a single chip image detector with an on-chip color filter. Moreover there is a need for on chip color balancing.

Another need for an image detector is a compact lens arrangement to focus light and reduce the size of each individual light sensitive region in the device.

Referring to FIG. 6, a series of hexagonal clusters 80, 80' 80", 82, 82', 82", 84, 84', 84" is provided with one cluster per pixel. Each cluster 80, 80' 80", 82, 82', 82", 84, 84', 84" is composed of three diamond shaped RGB cells in each cluster which are arranged into a composite arrangement of the cells packed into a compact structure. In clusters 80, 80' 80" the green cells G are on the bottom, the red cells R on the upper right and the blue cells B on the left. In clusters 82, 82' 82" the red cells R are on the bottom, the blue cells B on the upper right and the green cells G on the left.

Figure 7:
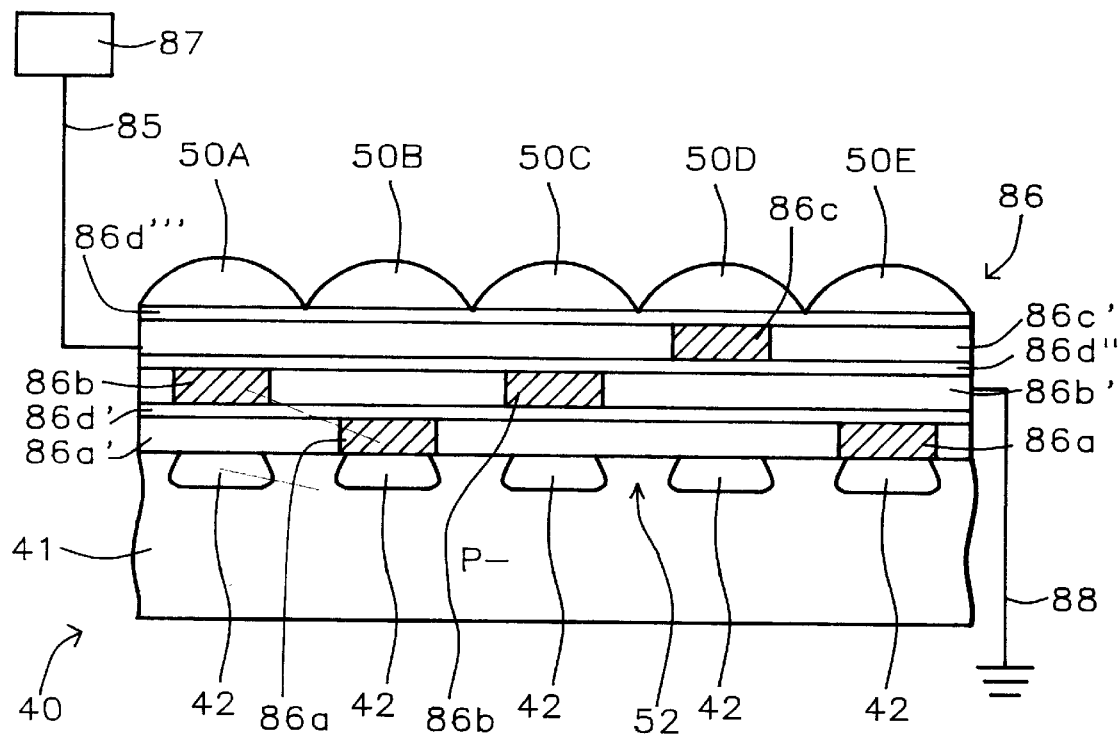
FIG. 7 shows a sectional view of a device in accordance with this invention illustrating how differentiation in optical characteristics for each color filter may be achieved by applying electrical stimuli to a variable optical passband filter. The filter is formed of three separate layers with separating dielectric layers.

Referring to FIG. 7, differentiation in optical characteristics for each color filter may also be achieved by applying electrical stimuli to a variable passband filter 86. The filter 86 is formed of three separate layers 86a', 86b', and 86c' with respective filters 86a, 86b, and 86c therein. Layers 86a', 86b', and 86c' are separated by dielectric layers 86d', 86d", and 86d'''.

Variable passband filter 86 is formed over the surfaces of sensors 42 and the substrate 41. The variable passband filter 86 is energized by signals on line 85 from on-chip timing control unit 87 which provides a signal to each of the variable passband filter layers 86a', 86b', and 86c'. The timing signals from unit 87 are synchronized with the precharge and read timing signals which energize and read from each photodiode.

Such stimuli might be (generated on-chip or off-chip, in either of which cases each group of color-composite sensing cells could physically consist of a single photodiode associated with a time-varying color filter.

The variable passband color filter would comprise a liquid crystal material which changes its optical properties (color) depending on the electrical stimulus applied thereto.

Pixel-Group Staggering

If a regular grid-like arrangement of rows and columns of rectangular detector cells is used for the photodiode array, there will be rows and columns of light insensitive areas in the array.

This problem can be avoided by staggering the cells. Each group of color detector cells that represents a single picture element is staggered with respect to adjacent groups. This disperses the light insensitive areas, and thus makes for better picture quality.

A staggered layout arrangement of the detector cells within the photodiode-array so that the light-insensitive areas between detector cells are irregularly arranged. This prevents noticeable loss or resolution due to regular rows or columns of light-insensitive areas.

In FIG. 5C an example of group staggering of the type of cell 55 shown in FIG. 5B is shown. A group of detector cells 61–76, etc has a layout of a regular hexagon. Thus, the matrix array is arranged as a "honeycomb" of such groups of a group of cells based on detector cell 55. The concept of cell staggering may also be applied to black and white image detector arrays.

Irregular Arrangement Of Detector Cells In Each Pixel Group

Optional irregular arrangements or R-G-B detector cells within each group or detector cells that compose a single picture element are provided. For example, one group of detector cells may be arranged as R-G-B, while another is arranged as G-R-B. This arrangement further reduces parallel errors between each color component of an overall image signal.

One R-G-B cell 55 comprises a detector for one pixel Other color systems are possible, as follows:

| Magenta | RB [RED BLUE] |
| Cyan | BG [BLUE GREEN] |
| Yellow | RG [RED GREEN] |

On-Chip Color Balancing

An on-chip color-balancing scheme ensures that the final chip output signal is properly color-balanced to suit user preferences. Color balancing involves scaling each color signal by a scale factor. The scale factor coefficients are hardwired. Alternatively the scale factor coefficients are loaded onto chip memory from the external world. In still another embodiment they are be determined by the chip during its calibration cycle. The scale factor coefficients may be analogue or digital values.

Figure 8:
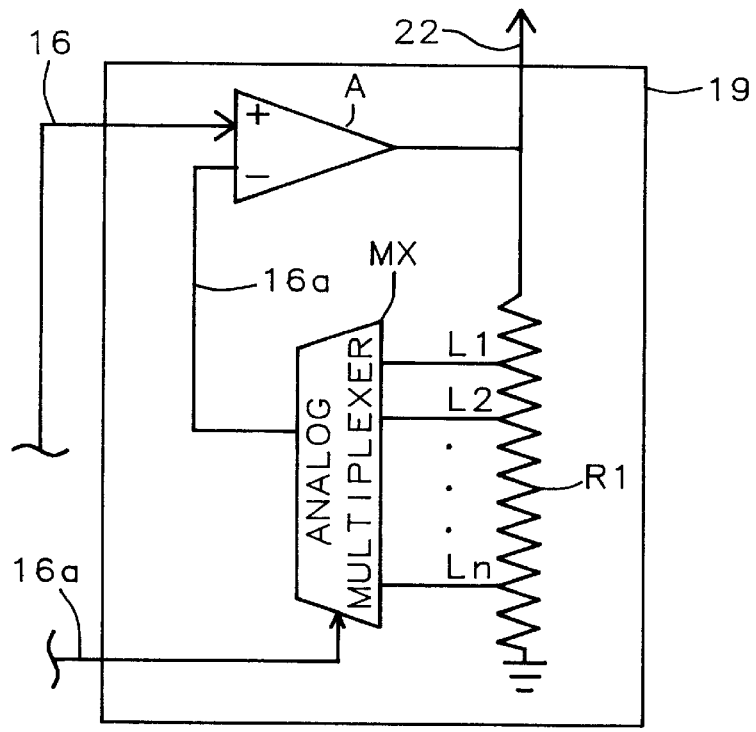
FIG. 8 is a circuit diagram of the color balancing on-chip variable gain amplifier seen in FIG. 1.

Color balancing is done on-chip by the variable gain amplifiers 19, 20 and 21 seen in FIG. 1. The structure of a variable gain amplifier 19 is shown by the circuit diagram of FIG. 8. It comprises an operational amplifier A, a resistor R1 (with a typical resistance of 50,000 Ω (ohms) and an analog multiplexer MX with a plurality of input lines L1, L2, . . . Ln which are connected to receive inputs from various points along the resistor R1 which has a number of taps along the length thereof. The analog multiplexer MX receives an input on select line 16a from the output of the gain setting register 19a in FIG. 1. The signal on the select line 16a controls the amount of negative feedback supplied to the operational amplifier A, as will be well understood by those skilled in the art of operational amplifiers and negative feedback systems. The amplifier A has its positive input connected to receive inputs on line 16 from the pixel detector 15. The negative input of amplifier A is connected to the output of analog multiplexer MX. The resistor has its ends connected between the output of amplifier A and ground (reference potential.) The analog multiplexer MX along with the resistor R1 forms a variable potential divider. The output of the variable gain amplifier 19 is provided on line 22 which is connected to the output of operational amplifier A and to the high voltage end of resistor R, which as stated above is connected to ground at the opposite end thereof.

The scaling operation may take place anywhere in the each color signal path. For example, each color signal may be amplified by a different factor at the sense amplifiers, at post-amplifiers, which follow the sense amplifiers.

Scaling may also take place in a digital circuit in the signal paths if the image signals are converted to digital form; in this case, digital scaling could take the form of a fixed or floating point multiplication of the each color signal with the scale factor coefficients.

The coefficients may be hardwired in various ways. One method is to use differently-sized, active, light detection areas for different color detector cells. Another method uses capacitor or resistor ratios to scale the color signals. In the digital domain, the coefficients could be stored in digital memory (e.g. ROM (Read Only Memories), or PLA (Programmable Logic Arrays)).

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. An integrated circuit color camera chip which functions as an image detector system, said single semiconductor, integrated circuit chip including an image detector system being formed in a region of a single semiconductor chip comprising:

said single semiconductor, integrated circuit chip including an entire color camera formed of integrated circuits, said integrated circuits in said semiconductor chip including a two-dimensional array of rows and columns of color detector cells each having a surface, with said color detector cells formed in said semiconductor chip, a plurality of passband filter means for selectively detecting electromagnetic radiation within a plurality of bands of electromagnetic information, with each of said passband filter means being formed on a said surface of a corresponding one of said detector cells on said semiconductor chip, each of said detector cells in said single semiconductor, integrated circuit chip having a photodiode formed in said chip, a precharge control transistor, and a sensing control transistor formed in said chip for writing signals to and reading signals from said photodiode, each of said cells comprising a photodiode with a common drain region in said substrate, said common drain region being shared by said precharge control transistor, said sensing control transistor, and said diode between a set of said gate electrodes of said precharge control transistor, said sensing control transistor, and a pair of source regions formed in said substrate adjacent to said gate electrodes on the distal side thereof from said common drain region, with said drain region and said chip forming a PN photodiode on said single integrated circuit semiconductor chip, each of said cells in said chip including means for sensing incident electromagnetic radiation of a plurality of predetermined ranges of electromagnetic wavelengths by virtue of associated passband filter means for said wavelength formed on said single semiconductor, integrated circuit chip over said photodiodes on said integrated circuit, with said filter means on said single semiconductor, integrated circuit chip having a diversity of passbands associated with different cells in a group, wherein said circuit is implemented in a technology selected from the group consisting of CMOS, PMOS, NMOS, BiCMOS and BiMOS technologies.

2. An integrated circuit color camera chip as claimed in claim 1 with an array of charge sense-amplifiers formed on said chip closely associated with said detector cells.

3. An integrated circuit color camera chip as claimed in claim 2, wherein:

separate signal paths are located on said chip for said plurality of detector cells, whereby individual radiation information is not lost.

4. An integrated circuit color camera chip as claimed in claim 3, wherein:

located on said integrated circuit chip is means for radiation band-differentiation provided by means for providing filtration of radiation band filters, said means for radiation band-differentiation is located on said integrated circuit chip, whereby a single matrix detector array provides accurate radiation band image reproduction in a radiation band image sensing system.

5. An integrated circuit color camera chip, as claimed in claim 4 wherein:

said radiation bands are bands of color passed through a color filter and said system provides color signals from said cells, wherein located on said integrated circuit chip is a color band-balancing system is provided for scaling a color signal anywhere in its on-chip signal path, whereby the magnitude of the scaling transformation is adapted to be adjusted externally to provide hue control and enhanced color reproduction.

6. An integrated circuit as claimed in claim 5 wherein each color sensing cell has its own charge sense-amplifier located on said integrated circuit chip.

7. An integrated circuit as claimed in claim 5 wherein said color sensing cells share charge sense-amplifiers located on said integrated circuit chip between a plurality of detector cells of a particular color in a column.

8. An integrated circuit as claimed in claim 5, with color sensing cells sharing charge sense-amplifiers located on said integrated circuit between several detector cells located on said integrated circuit of a predetermined color passband in a column of cells.

9. A chip in accordance with claim 2 wherein:
at least two separately positioned integrated circuit image detectors in said chip allow a three-dimensional image to be captured, by a means selected from:
a) detecting phase information of the incident image on each image detector,
b) using means employing triangulation to detect the three-dimensional position of a colored object and
c) a combination of detecting phase information and triangulation.

10. An integrated circuit as claimed in claim 1 wherein located on said integrated circuit chip are said detector cells arranged in groups of a plurality of cells having different passbands of sensitivity to staggered arrangement of color detector cells within each pixel group comprising a group of detector cells which detect a single picture element, said staggered arrangement allowing said circuit to detect changes in luminance at boundaries between groups of detector cells.

11. An integrated circuit as claimed in claim 10 which uses an irregular layout arrangement of detector cells located on said integrated circuit chip in a said pixel group of the photodiode array located on said integrated circuit chip.

12. An integrated circuit as claimed in claim 1, with embedded color-encoding circuitry located on said integrated circuit and power-amplification circuitry located on said integrated circuit for driving a device selected from the group consisting of a read device and a television receiver.

13. A integrated circuit in accordance with claim 1 wherein said device is able to output a composite video signal encompassing all the color image information, or to output several individual color or luminance signals is provided to a read or display device.

14. A integrated circuit in accordance with claim 1 wherein said integrated circuit detects both still image and moving image signals.

15. A integrated circuit in accordance with claim 1 wherein said integrated circuit is incorporated in a lightweight, portable, miniature camera system.

16. A integrated circuit in accordance with claim 1 wherein said integrated circuit is incorporated in a low power camera for use in portable applications.

17. A color camera chip with system formed therein in accordance with claim 1 wherein:
at least two separately positioned integrated circuit image detectors in said chip allow a three-dimensional image to be captured, by a means selected from:
a) detecting phase information of the incident image on each image detector,
b) using means employing triangulation to detect the three-dimensional position of a colored object, and
c) a combination of detecting phase information and triangulation.

18. An image detector on a single integrated circuit semiconductor chip comprising:

said single semiconductor chip comprising an entire image detector formed of integrated circuits, said single integrated circuit semiconductor chip including a two-dimensional array of rows and columns of color detector cells with said detector cells being associated with associated passband filter means formed on said single semiconductor integrated circuit chip for selectively detecting electromagnetic radiation within a plurality of bands of electromagnetic information, said associated passband filter means being formed on said single semiconductor integrated circuit semiconductor chip, each of said detector cells formed on said single semiconductor integrated circuit chip having therein a photodiode a precharge control transistor, and a sensing control transistor for writing signals to and reading signals from said photodiode, each of said cells comprising a photodiode with a common drain region formed in said substrate, said common drain region being shared by said precharge control transistor, said sensing control transistor, and said diode between a set of said gate electrodes of said precharge control transistor, said sensing control transistor, and a pair of source regions formed in said substrate adjacent to said gate electrodes, on the distal side thereof from said common drain region, with said drain region and said chip forming a PN photodiode on said single integrated circuit semiconductor chip, each of said cells on said single semiconductor integrated circuit chip including means for sensing incident electromagnetic radiation of a plurality of predetermined ranges of electromagnetic wavelengths by virtue of said associated passband filter means for said wavelength formed over said photodiodes on said integrated circuit, with said filter means having a diversity of passbands associated with different cells in a said group, wherein said circuit is implemented in a technology selected from the group consisting of CMOS, PMOS, NMOS, BiCMOS and BiMOS technologies on said single semiconductor integrated circuit chip, said associated passband filter means being formed on the surface of said semiconductor chip above said detector cells.

19. A camera system comprising an integrated circuit chip in accordance with claim 18 wherein:
at least two separately positioned integrated circuit image detectors in said chip allow a three-dimensional image to be captured, by a means selected from:
a) detecting phase information of the incident image on each image detector,
b) using means employing triangulation to detect the three-dimensional position of a colored object and
c) a combination of detecting phase information and triangulation.

20. An integrated circuit formed on a single semiconductor chip which functions as a color image detector comprising:
said single semiconductor chip comprising said entire color image detector formed of integrated circuits,
a two-dimensional array of groups of detector cells formed on said single semiconductor integrated circuit chip, each group comprising several detector cells adapted for sensing a different complementary color passband color,
each of said detector cells having a photodiode and at least two transistors, including a precharge control transistor, and a sensing control transistor for writing to and reading from said photodiode formed in said single semiconductor chip, each of said cells comprising a said photodiode with a common drain region formed in said substrate, said common drain region being shared by said precharge control transistor, said sensing control transistor, and said diode between a set of said gate electrodes of said precharge control transistor, said sensing control transistor, and a pair of source regions formed in said substrate adjacent to said gate electrodes on the distal side thereof from said common drain region, with said drain region and said chip forming a PN photodiode on said single integrated circuit semiconductor chip, each of said groups of cells in said single semiconductor integrated circuit chip including means for sensing incident color in the light radiation range of wavelengths of a plurality of predetermined ranges of color wavelengths by virtue of associated passband filter means for said wavelength formed over said photodiodes on said integrated circuit, with said filter means having a diversity of passbands associated with different cells in a said group said filter means formed on the surface of said semiconductor chip above said detector cells, said associated passband filter means being formed on said single semiconductor integrated circuit chip, charge sense-amplifiers formed on said single semiconductor integrated circuit chip closely associated with said color detector cells being formed on said semiconductor chip, and separate signal paths formed on said single semiconductor integrated circuit chip for the plurality of detector cells within each picture element group being formed on said semiconductor chip, such a scheme ensuring that individual color information is not lost.

21. A camera system comprising an integrated circuit chip in accordance with claim 20 wherein at least two separately positioned integrated circuit image detectors in said chip allow a three-dimensional image to be captured, by a means selected from:
   a) detecting phase information of the incident image on each image detector,
   b) using means employing triangulation to detect the three-dimensional position of a colored object, and
   c) a combination of detecting phase information and triangulation.

22. An integrated circuit formed on a single semiconductor integrated circuit semiconductor chip which functions as an image detector system, said integrated circuit comprising:
   said single semiconductor integrated circuit chip comprising said entire color image detector formed of integrated circuits,
   a two-dimensional array of rows and columns of color detector cells formed in said formed on said single semiconductor integrated circuit chip with said cells being formed into groups of at least three detector cells,
   each of said detector cells having a photodiode, including a precharge control transistor, and a sensing control transistor for writing signals to and reading signals from said photodiode, formed in a region of said single semiconductor chip,
   each of said cells comprising a said photodiode with a common drain region formed in said substrate, said common drain region being shared by said precharge control transistor, said sensing control transistor, and said diode between a set of said gate electrodes of said precharge control transistor, said sensing control transistor, and a pair of source regions formed in said substrate adjacent to said gate electrodes on the distal side thereof from said common drain region, with said drain region and said chip forming a PN photodiode on said single integrated circuit semiconductor chip,
   each detector cell in a group of said detector cells being associated with a set of passband filter means formed in said said single semiconductor integrated circuit chip, for selectively detecting electromagnetic radiation within a different range of bands of electromagnetic information,
   each of said detector cells including, formed in said chip, means for sensing incident electromagnetic radiation of a plurality of predetermined ranges of electromagnetic wavelengths by virtue of an associated passband filter means formed on said single semiconductor integrated circuit chip, for said wavelength formed on a surface of said photodiodes in said integrated circuit, with said filter means having a diversity of passbands associated with different cells in a said group said filter means formed on the surface of said single semiconductor integrated circuit chip above corresponding ones of said detector cells.

23. An integrated circuit in accordance with claim 22 wherein said filter means comprises a set of filter elements formed on said semiconductor chip over each cell in a group of cells.

24. An integrated circuit chip in accordance with claim 22 wherein:
   said filter means comprises a set of passband filter elements formed on said semiconductor chip over each cell with as follows:
   a first set of filter elements cells with a first color range of filters laminated between a first transparent layer and a second transparent layer,
   a second set of filter elements cells with a second color range of filters laminated between a second transparent layer and a third transparent layer, and
   a third set of filter elements cells with a third color range of filters laminated between a third transparent layer and a fourth transparent layer.

25. A camera system comprising integrated circuits in accordance with claim 24 wherein at least two separately positioned integrated circuit image detectors in said chip allow a three-dimensional image to be captured, by a means selected from:
   a) detecting phase information of the incident image on each image detector,
   b) using means employing triangulation to detect the three-dimensional position of a colored object and
   c) a combination of detecting phase information and triangulation.

26. A camera system comprising integrated circuits in accordance with claim 22 wherein at least two separately positioned integrated circuit image detectors in said chip allow a three-dimensional image to be captured, by a means selected from:
   a) detecting phase information of the incident image on each image detector
   b) using means employing triangulation to detect the three-dimensional position of a colored object and
   c) a combination of detecting phase information and triangulation.

27. An integrated circuit color camera semiconductor chip comprising:
- said single semiconductor integrated circuit chip comprising said entire integrated circuit color camera formed of integrated circuits,
- a two-dimensional array of rows and columns of color detector cells, each having a surface, with said cells being formed into groups of at least three detector cells formed in said single semiconductor integrated circuit chip,
- each of said detector cells having a photodiode, a precharge control transistor, and a sensing control transistor for writing signals to and reading signals from said photodiode formed on a region of said single semiconductor integrated circuit chip,
- each of said cells comprising a said photodiode with a common drain region formed in said substrate, said common drain region being shared by the precharge control transistor, the sensing control transistor, and the diode between a set of said gate electrodes of the precharge control transistor, the sensing control transistor, and a pair of source regions formed in the substrate adjacent to said gate electrodes on the distal side thereof from the common drain region, with said drain region and said chip forming a PN photodiode on said single integrated circuit semiconductor chip,
- said detector cells, formed on said single semiconductor integrated circuit chip, each of the cells being covered with an adjustable passband filter means formed on the surface thereof said adjustable passband filter means formed on said single semiconductor integrated circuit chip being adapted for sequentially varying the electromagnetic radiation within a different range of bands of electromagnetic information as a function of time, said passband filter means formed on the surface of said semiconductor chip above said detector cells,
- each of said detector cells, formed on said chip, including means for sensing incident electromagnetic radiation formed on said single semiconductor integrated circuit chip, and
- formed on said single semiconductor integrated circuit chip is means for multiplexing the detected signals from said cells to provide multiple electrical passband output signals from said cells.

28. A camera system comprising integrated circuits in accordance with claim 27 wherein at least two separately positioned integrated circuit image detectors allow a three-dimensional image to be captured, by a means selected from:
- a) detecting phase information of the incident image on each image detector,
- b) using means employing triangulation to detect the three-dimensional position of a colored object and
- c) a combination of detecting phase information and triangulation.

29. A method of forming an integrated circuit image detector cell formed on a single lightly doped P- integrated circuit semiconductor chip by the steps comprising:
- forming a gate oxide layer on said chip,
- forming a blanket layer of polysilicon on said single integrated circuit semiconductor chip,
- patterning said polysilicon layer into a set of gate electrodes of a precharge control transistor and a sensing control transistor on said single integrated circuit semiconductor chip,
- forming a photodiode having a surface in a said detector cell with a common drain region of said photodiode, said precharge control transistor and said sensing control transistor, said common drain region being located between said set of said gate electrodes, and forming a pair of source regions adjacent to said gate electrodes on the distal side thereof from said common drain region by ion implantation into said substrate of said chip, with said drain region and said chip forming a PN photodiode in said single integrated circuit semiconductor chip,
- said cell being formed in a region of said single integrated circuit semiconductor chip, and
- depositing a radiation passband filter over said photodiode on said surface of said photodiode.

30. A method in accordance with claim 29 wherein said passband filter is formed by forming a set of transparent layers over said chip with a passband filter located over said photodiode.

31. A method in accordance with claim 30 wherein a group of said photodiodes in said detector cells in said chip are formed into groups of at least three adjacent photodiodes in detector cells and a set of different passband filters is formed in said chip for each said group of cells by forming a set of transparent layers over said device with a different passband wavelength range filter located over different ones of said photodiodes, and a lenslet is formed on said chip over each of said passband filters.

32. A method in accordance with claim 31 wherein:
- said cells are formed into a two-dimensional array of rows and columns of color detector cells in said chip with said detector cells being associated with passband filter means for selectively detecting electromagnetic radiation within a plurality of bands of electromagnetic information,
- each of said cells including means for sensing incident electromagnetic radiation of a plurality of predetermined ranges of electromagnetic wavelengths by virtue of associated passband filter means for said wavelength formed over said photodiodes in said chip, with said filter means having a diversity of passbands associated with different cells in a said group, wherein said circuit is implemented in a technology selected from the group consisting of CMOS, PMOS, NMOS, BiCMOS and BiMOS technologies.

33. A method in accordance with claim 30 wherein said passband filter is formed by a variable wavelength passband filter located over said photodiode.

34. A method in accordance with claim 33 wherein:
- said cells are formed into a two-dimensional array of rows and columns of color detector cells with said detector cells being associated with passband filter means for selectively detecting electromagnetic radiation within a plurality of bands of electromagnetic information,
- each of said cells including means for sensing incident electromagnetic radiation of a plurality of predetermined ranges of electromagnetic wavelengths by virtue of associated passband filter means for said wavelength formed over said photodiodes on said integrated circuit, with said filter means having a diversity of passbands associated with different cells in a said group, wherein said circuit is implemented in a technology selected from the group consisting of CMOS, PMOS, NMOS, BiCMOS and BiMOS technologies.

35. A method in accordance with claim 29 wherein a lenslet is formed on said chip over said passband filter.

36. A camera on a chip, comprising:
- a substrate, including an array of pixesl with each including a detector cell comprising a light collecting element which each receives light and stores electronic information in an amount indicative of an amount of light received;

each of said detector cells in said substrate of said chip having a photodiode, a precharge control transistor, and a sensing control transistor formed in said chip for writing signals to and reading signals from said photodiode, each of said cells comprising a photodiode with a common drain region in said substrate, said common drain region being shared by said precharge control transistor, said sensing control transistor, and said diode between a set of said gate electrodes of said precharge control transistor, said sensing control transistor, and a pair of source regions formed in said substrate adjacent to said gate electrodes on the distal side thereof from said common drain region, with said drain region and said chip forming a PN photodiode on said single integrated circuit semiconductor chip, and processing means integrated on said substrate comprising:
an array of charge sense-amplifiers formed on said chip closely associated with said light collecting elements, a single matrix detector array providing accurate radiation band image reproduction in a radiation band image sensing system, wherein circuitry in said control area is formed of MOS devices and said pixel area incorporates MOS devices.

* * * * *